(12) United States Patent  
Arita et al.

(10) Patent No.: US 8,394,669 B2  
(45) Date of Patent: Mar. 12, 2013

(54) RESISTANCE VARIABLE ELEMENT AND RESISTANCE VARIABLE MEMORY DEVICE

(75) Inventors: Koji Arita, Osaka (JP); Takumi Mikawa, Shiga (JP); Atsushi Himeno, Osaka (JP); Yoshio Kawashima, Osaka (JP); Kenji Tominaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 155 days.

(21) Appl. No.: 13/128,575

(22) PCT Filed: Jul. 12, 2010

(86) PCT No.: PCT/JP2010/004498  
§ 371 (c)(1),  
(2), (4) Date: May 10, 2011

(87) PCT Pub. No.: WO2011/007538  
PCT Pub. Date: Jan. 20, 2011

(65) Prior Publication Data  
US 2011/0220862 A1    Sep. 15, 2011

(30) Foreign Application Priority Data  
Jul. 13, 2009  (JP) .................................. 2009-165076

(51) Int. Cl.  
*H01L 21/02*  (2006.01)  
*H01L 45/00*  (2006.01)  
(52) U.S. Cl. ............... 438/104; 257/74; 257/E45.003; 257/E21.004  
(58) Field of Classification Search ........... 438/104; 257/4, E45.003, E21.004  
See application file for complete search history.

(56) References Cited

U.S. PATENT DOCUMENTS

| 6,753,561 B1 | 6/2004 | Rinerson et al. |
| 7,884,346 B2 * | 2/2011 | Mikawa et al. .................. 257/4 |
| 2005/0174835 A1 | 8/2005 | Rinerson et al. |

(Continued)

FOREIGN PATENT DOCUMENTS

| EP | 2 209 139 A1 | 7/2010 |
| JP | 2007-287761 | 11/2007 |

(Continued)

OTHER PUBLICATIONS

R. Meyer et al., "Oxide Dual-Layer Memory Element for Scalable Non-Volatile Cross-Point Memory Technology," IEEE Proceedings of 9th Non-Volatile Memory Technology Symposium, p. 1-5, Nov. 2008.

*Primary Examiner* — Calvin Lee  
*Assistant Examiner* — Monica D Harrison  
(74) *Attorney, Agent, or Firm* — McDermott Will & Emery LLP

(57) ABSTRACT

A resistance variable element (100) used in a through-hole cross-point structure memory device, according to the present invention, and a resistance variable memory device including the resistance variable element, includes a substrate (7) and an interlayer insulating layer (3) formed on the substrate, and have a configuration in which a through-hole (4) is formed to penetrate the interlayer insulating layer, a first resistance variable layer (2) comprising transition metal oxide is formed outside the through-hole, a second resistance variable layer (5) comprising transition metal oxide is formed inside the through-hole, the first resistance variable layer is different in resistivity from the second resistance variable layer, and the first resistance variable layer and the second resistance variable layer are in contact with each other only in an opening (20) of the through-hole which is closer to the substrate.

18 Claims, 26 Drawing Sheets

U.S. PATENT DOCUMENTS

| | | |
|---|---|---|
| 2006/0050598 A1 | 3/2006 | Rinerson et al. |
| 2006/0171200 A1 | 8/2006 | Rinerson et al. |
| 2006/0245243 A1 | 11/2006 | Rinerson et al. |
| 2007/0240995 A1 | 10/2007 | Odagawa et al. |
| 2008/0083918 A1 | 4/2008 | Aratani et al. |
| 2008/0089121 A1 | 4/2008 | Aochi et al. |
| 2008/0109775 A1 | 5/2008 | Norman |
| 2008/0293196 A1 | 11/2008 | Rinerson et al. |
| 2009/0045390 A1 | 2/2009 | Rinerson et al. |
| 2009/0231906 A1 | 9/2009 | Rinerson et al. |
| 2009/0283736 A1 | 11/2009 | Kanzawa et al. |
| 2009/0303772 A1 | 12/2009 | Rinerson et al. |
| 2009/0303773 A1 | 12/2009 | Rinerson et al. |
| 2010/0061142 A1 | 3/2010 | Arita et al. |
| 2010/0090193 A1 | 4/2010 | Mikawa et al. |
| 2010/0157657 A1 | 6/2010 | Rinerson et al. |

FOREIGN PATENT DOCUMENTS

| | | |
|---|---|---|
| JP | 2008-085071 | 4/2008 |
| JP | 2008-305889 | 12/2008 |
| JP | 2009-105383 | 5/2009 |
| WO | WO 2006/029228 A2 | 3/2006 |
| WO | WO 2007/102341 A1 | 9/2007 |
| WO | WO 2008/117494 | 10/2008 |
| WO | WO 2008/149484 A1 | 12/2008 |
| WO | WO 2009/050833 A1 | 4/2009 |
| WO | WO 2009/081595 A1 | 7/2009 |

\* cited by examiner (a)

(b)

(a)

(b)

(a)

(b)

(c)

(d)

(a)

(b)

(c)

(d)

(a)

(b)

(a)

(b)

(a)

(b)

(c)

(d)

(a)

(b)

(c)

(d)

(a)

(b)

(c)

(d)

(a)

(b)

(c)

(d)

(a)

(b)

(a)

(b)

(a)

(b)

RESISTANCE VARIABLE ELEMENT AND RESISTANCE VARIABLE MEMORY DEVICE

RELATED APPLICATIONS

This application is the U.S. National Phase under 35 U.S.C. §371 of International Application No. PCT/JP2010/004498, filed on Jul. 12, 2010, which in turn claims the benefit of Japanese Application No. 2009-165076, filed on Jul. 13, 2009, the disclosures of which Applications are incorporated by reference herein.

TECHNICAL FIELD

The present invention relates to a resistance variable element (ReRAM element) and a resistance variable memory device (ReRAM memory device) having a configuration in which such resistance variable elements are arranged in matrix. More specifically, the present invention relates to a resistance variable element including two or more resistance variable layers and a resistance variable memory device having a configuration in which such resistance variable elements are arranged in matrix.

BACKGROUND ART

In recent years, use of a so-called resistance variable element (ReRAM element) as a memory element has been proposed. Such a resistance variable element has a resistance variable layer formed mostly of a metal oxide. Upon application of electric pulses to the resistance variable layer, its resistance values change and the changed resistance values are retained. By corresponding a high-resistance state and a low-resistance state of the resistance variable layer to data "1" and data "0" of binary data, respectively, for example, the binary data can be stored. The electric pulses are applied so that an electric field between both ends of the resistance variable layer and a current density at end surfaces of the resistance variable layer are generated to sufficiently change a physical state of the resistance variable layer and not to destroy the resistance variable layer. The electric pulse may be applied several times.

As a memory device using the above resistance variable element, a cross-point memory structure is known. In this structure, a memory plug is formed at a location where upper and lower wires three-dimensionally cross each other, and a resistance variable layer having a bipolar characteristic and a diode are arranged in series in a stack direction, inside the memory plug, thereby achieving high-dense integration and suppressing a cross talk (e.g., see patent literature 1).

From recent study results relating to the resistance variable element, it is found out that by forming the resistance variable layer consisting of a single layer conventionally as having a layer-stacked structure including two resistance variable layers, a favorable characteristic as the resistance variable element is achieved.

For example, non-patent literature 1 discloses that an insulator layer comprising an oxide and a metal resistance variable layer being electrically conductive are stacked together to form a resistance variable layer. In such a configuration, by controlling a thickness of the insulator layer, a so-called forming step (step of applying an electric stress to a resistance variable element after a step of layer stacking completes to enable the resistance variable element to switch its resistance state) may be dispensed with. In addition, a value of a current flowing through the resistance variable element can be controlled.

Patent literature 2 discloses a configuration of the resistance variable layer in which a first tantalum oxide layer having a composition expressed as $TaO_x$ ($0<x<2.5$) and a second tantalum oxide layer having a composition expressed as $TaO_y$ ($x<y$) are stacked together. In such a configuration, the forming step is unnecessary. Further, a high-speed, reversible and stable rewrite characteristic and a good resistance value retention characteristic are attained.

CITATION LIST

Patent Literature

Patent literature 1: U.S. Pat. No. 6,753,561 specification
Patent literature 2: International Publication No. WO2008/149484
Patent literature 3: Translated International Publication No. 2008-512857
Patent literature 4: International Publication No. WO2008/117494

Non-Patent Literature

Non-patent literature 1: R. Meyer et al. IEEE Proceeding of 9th Non-Volatile Memory Technology Symposium, page 1-5, November 2008

SUMMARY OF THE INVENTION

Technical Problem

As recited in patent literature 2, to implement a favorable resistance variable element, it is desirable to provide a configuration (hereinafter referred to as a layer-stacked structure) in which the resistance variable layer is composed of two or more resistance variable layers with different resistivities. In contrast, to provide highly integrated elements or miniaturized elements, in a cross-point memory, it is desirable to provide a structure (hereinafter referred to as through-hole cross-point structure) in which an element is formed by utilizing a through-hole formed in an interlayer insulating layer. However, when the layer-stacked structure of the resistance variable layer is applied to the through-hole cross-point structure, manufacturing steps become difficult.

The configuration disclosed in patent literature 1 is such that a current controlling element and a resistance variable element are stacked together. Therefore, it is necessary to stack layers comprising at least six different materials. It is not easy to form such a complicated layer-stacked structure including multiple layers inside the hole. In particular, to form a highly integrated and miniaturized cross-point memory, the through-hole constituting the memory is miniaturized and its diameter is inevitably small. It is rather difficult to form the layer-stacked structure including multiple layers inside such a miniaturized through-hole. Such a configuration is unfavorable in terms of a yield or the like.

In a case where the resistance variable layer is formed into a layer-stacked structure in the memory structure disclosed in patent literature 1, it is necessary to stack at least seven layers inside one through-hole, which makes it more difficult to form the element structure (In patent literature 1, the memory plug is constituted by the current controlling element and the resistance variable element. If only the resistance variable element is formed inside the through-hole in such a configuration, the layers stacked inside the through-hole increase by using the layer-stacked structure). Besides, it is necessary to properly control a thickness, a composition, etc. of each layer constituting the resistance variable layer. Therefore, in a case where the resistance variable layer has a layer-stacked structure in the through-hole cross-point structure, a manufacturing technique becomes more difficult, and it is difficult to ensure a high productivity and reliability of the element.

The present invention is directed to solve the above mentioned problem, and one object of the present invention is to easily implement a layer-stacked structure of a resistance variable layer in a resistance variable element used in a through-hole cross-point structure memory device, and a resistance variable memory device including the resistance variable element.

Solution to Problem

To solve the problem, a resistance variable element of the present invention, comprises a substrate; a first electrode formed on the substrate; a second electrode; and an interlayer insulating layer; wherein a through-hole is formed to penetrate the interlayer insulating layer; a first resistance variable layer comprising transition metal oxide is formed outside the through-hole such that the first resistance variable layer is connected to the first electrode located outside the though-hole; a second resistance variable layer comprising transition metal oxide is formed inside the through-hole; the second electrode is formed on the second resistance variable layer; the first resistance variable layer is different in resistivity from the second resistance variable layer; the first resistance variable layer and the second resistance variable layer are in contact with each other only in one of openings of the through-hole, which opening is closer to the substrate; and an electric resistance between the first electrode and the second electrode changes by application of an electric pulse between the first electrode and the second electrode.

In such a configuration, a thickness variation in the first resistance variable layer is lessened and a characteristic of the element is made more uniform.

On the other hand, in a case where the second resistance variable layer is formed inside the through-hole and the first resistance variable layer is formed to cover the upper opening of through-hole, there is a level difference between an upper end surface of the second resistance variable layer inside the through-hole and an upper end surface of the interlayer insulating layer in which the through-hole is formed, along an outer edge of the through-hole. This results in a difference in thickness of the first resistance variable layer, between inside the through-hole and an outer edge region of the through-hole. However, in the configuration of the present invention, since the first electrode and the first resistance variable layer are formed on the substrate and below the through-hole such that they have the same wire shape when viewed from a thickness direction. Therefore, a thickness variation in the first resistance variable layer is lessened and a characteristic such as a resistance changing characteristic is made more uniform.

In the resistance variable element, the resistivity of the transition metal oxide of the first resistance variable layer may be higher than the resistivity of the transition metal oxide of the second resistance variable layer.

In such a configuration, the thickness of the first resistance variable layer which is the high-resistance variable layer is made uniform. Typically, the thickness of the high-resistance variable layer is as small as about 2~10 nm. By making the thickness of the high-resistance variable layer uniform, an operation is stabilized and reliability is improved.

In the resistance variable element, the second resistance variable layer may cover a bottom portion and a side wall of the through-hole, and the resistance variable element may further comprise an electrode filled inside the through-hole such that the electrode is located on the second resistance variable layer.

In such a configuration, the thickness of the second resistance variable layer at the bottom portion of the through-hole, which contributes to a device characteristic, is determined based on the device characteristic, and a gap in the through-hole, which is defined by the second resistance variable layer, is filled with the second electrode with a lower resistance, thereby reducing a parasitic resistance and preventing a wire delay. At least, it is technically difficult to form a binary transition metal oxide inside the through-hole such that its composition and its filling characteristic are both satisfied. By filling an electrode (e.g., mono-element electrode) which has been developed in practice into this gap in the through-hole, an advantage is achieved in a manufacturing method.

In the resistance variable element, the first resistance variable layer may cover entire of the opening of the through-hole which is closer to the substrate and protrudes outward over the entire opening when viewed from a thickness direction of the interlayer insulating layer; and the second resistance variable layer may cover entre of the one of the openings of the through-hole and does not protrude outward over the one of the openings when viewed from the thickness direction of the interlayer insulating layer.

In the resistance variable element, each of the transition metal oxide of the first resistance variable layer and the transition metal oxide of the second resistance variable layer may be an oxide of at least one transition metal which is selected from a group consisting of Ta, Hf and Zr.

In the resistance variable element, the transition metal oxide of the first resistance variable layer and the transition metal oxide of the second resistance variable layer may be tantalum oxides, respectively. When one of the tantalum oxides is expressed as $TaO_x$, $0.8 \leq x \leq 1.9$ may be satisfied; and when the other tantalum oxide is expressed as $TaO_y$, $x<y$ may be satisfied.

In the resistance variable element, the resistivity of the transition metal oxide of the first resistance variable layer may be lower than the resistivity of the transition metal oxide of the second resistance variable layer.

In the resistance variable element, the resistivity of the transition metal oxide of the first resistance variable layer may be higher than the resistivity of the transition metal oxide of the second resistance variable layer; and the resistance variable element may comprise an etching stopper layer formed between the interlayer insulating layer and the first resistance variable layer, the etching stopper layer having a resistance to etching using an etching gas containing a fluorine compound gas, and the through-hole may penetrate the interlayer insulating layer and the etching stopper layer.

In the resistance variable element, the etching stopper layer may comprise at least one material selected from a group consisting of silicon nitride (SiN), silicon oxynitride (SiON) and silicon carbon nitride (SiCN).

In the resistance variable element, the etching stopper layer may have a thickness which is not less than 5 nm.

A resistance variable memory device of the present invention comprises a substrate; a plurality of first wires formed within a first plane parallel to a main surface of the substrate to extend in parallel with each other in a first direction; a plurality of second wires formed within a second plane parallel to the first plane to extend in parallel with each other in a second direction and three-dimensionally cross the plurality of first wires, respectively; and memory cells respectively formed at three-dimensional cross-points of the first wires and the second wires; each of the memory cells including the resistance variable element as recited in claim 1 and a current controlling element connected in series with the resistance variable element; and the interlayer insulating layer being formed between the first plane and the second plane.

In the resistance variable memory device, the current controlling element may cover one of openings of the through-hole corresponding to the resistance variable element constituting a memory cell, which opening is not covered with the first resistance variable layer, the memory cell including the current controlling element and the resistance variable element.

In the resistance variable memory device, the current controlling element may be formed at one of both sides of the interlayer insulating layer, where the first resistance variable layer of the resistance variable element constituting a memory cell is provided, the memory cell including the current controlling element and the resistance variable element.

In the resistance variable memory device, the current controlling element may be at least one element selected from a group consisting of a MIM diode, a MSM diode, and a varistor.

A method of manufacturing a resistance variable element of the present invention comprises a first electrode forming step of forming a first electrode on a substrate; a first resistance variable layer forming step of forming a first resistance variable layer comprising transition metal oxide, on the first electrode; an interlayer insulating layer forming step of forming an interlayer insulating layer on the first resistance variable layer; a through-hole forming step of forming a through-hole on the first resistance variable layer such that the through-hole penetrates the interlayer insulating layer; a second resistance variable layer forming step of forming a second resistance variable layer comprising transition metal oxide such that the second resistance variable layer is in contact with the first resistance variable layer only in the one of the openings of the through-hole, inside the through-hole, the second resistance variable layer being different in resistivity from the first resistance variable layer; and a step of forming a second electrode on the second resistance variable layer; an electric resistance between the first electrode and the second electrode changes by application of an electric pulse between the first electrode and the second electrode.

In the method of manufacturing the resistance variable element, the first resistance variable layer may cover entire of the one of the openings of the through-hole, and protrudes outward over the one of the openings.

The method of manufacturing the resistance variable element may further comprise an etching stopper layer forming step of forming an etching stopper layer on the first resistance variable layer, between the first resistance variable layer forming step and the interlayer insulating layer forming step, the etching stopper layer having a resistance to etching using an etching gas containing a fluorine compound gas, and in the interlayer insulating layer forming step, the interlayer insulating layer may be formed on the first resistance variable layer and the etching stopper layer.

In the method of manufacturing the resistance variable element, in the through-hole forming step, the interlayer insulating layer may be etched using an etching gas containing a fluorine-compound gas, and the etching stopper layer may be etched using an inactive gas.

The above and further objects, features and advantages of the present invention will more fully be apparent from the following detailed description of preferred embodiments with accompanying drawings.

Advantageous Effects of the Invention

The present invention has the above described configuration and achieves the following advantages. It is possible to easily implement a memory cell array having a layer-stacked structure of a resistance variable layer, in a memory cell including a resistance variable element used in a memory device having a through-hole cross-point memory cell array, and a memory device including the memory cell.

BRIEF DESCRIPTION OF THE DRAWINGS

FIG. 1 is a view showing an exemplary schematic configuration of a resistance variable element 100 according to Embodiment 1 of the present invention, in which FIG. 1(a) is a cross-sectional view and FIG. 1(b) is a plan view. FIG. 1(a) is a cross-sectional view taken in the direction of arrow along line A-A' in FIG. 1(b).

FIG. 3 is step cross-sectional views showing an exemplary method of manufacturing the resistance variable element according to Embodiment 1 of the present invention, in which FIG. 3(a) is a cross-sectional view showing a step of forming a first wire on a substrate, FIG. 3(b) is a cross-sectional view showing a step of stacking a first electrode material and a first resistance variable material on the first wire, FIG. 3(c) is a cross-sectional view showing a step of completing a first electrode and a first resistance variable layer, and FIG. 3(d) is a cross-sectional view showing a step of forming an interlayer insulating layer to cover the first electrode and the first resistance variable layer.

FIG. 4 is step cross-sectional views showing an exemplary method of manufacturing the resistance variable element according to Embodiment 1 of the present invention, in which FIG. 4(a) is a view showing a step of forming a through-hole in the interlayer insulating layer, FIG. 4(b) is a view showing a step of stacking a second resistance variable material and a second electrode material such that the through-hole is filled with the second resistance variable material and the second electrode material, FIG. 4(c) is a view showing a step of forming a second resistance variable layer and a second electrode such that the interlayer insulating layer is exposed, and FIG. 4(d) is a view showing a step of forming a second wire such that the second wire covers the second resistance variable layer and the second electrode which are exposed in one of openings of the through-hole.

FIG. 7 is views showing a case where the through-hole is displaced with respect to a predetermined location in the resistance variable element according to Embodiment 1 of the present invention, in which FIG. 7(a) shows a case where no displacement occurs and FIG. 7(b) shows a case where a displacement occurs.

FIG. 8 is views showing a case where the through-hole is displaced with respect to a predetermined location, in a case where the first resistance variable layer and the second resistance variable layer are formed outside the through-hole, and only the electrode is formed inside the through-hole in which FIG. 8(a) shows a case where no displacement occurs and FIG. 8(b) shows a case where a displacement occurs.

FIG. 10 is step cross-sectional views showing an exemplary method of manufacturing the resistance variable element according to modification example 3 of Embodiment 1 of the present invention, in which FIG. 10(a) is a cross-sectional view showing a step of forming the first wire on the substrate, FIG. 10(b) is a cross-sectional view showing a step of stacking the first electrode material and the first resistance variable material on the first wire, FIG. 10(c) is a cross-sectional view showing a step of completing the first electrode and the first resistance variable layer, and FIG. 10(d) is a cross-sectional view showing a step of forming the interlayer insulating layer such that the interlayer insulating layer covers the first electrode and the first resistance variable layer.

FIG. 11 is step cross-sectional views showing an exemplary method of manufacturing the resistance variable element according to modification example 3 of Embodiment 1 of the present invention, in which FIG. 11(a) is a cross-sectional view showing a step of forming the through-hole in the interlayer insulating layer, FIG. 11(b) is a cross-sectional view showing a step of depositing the second resistance variable material such that the through-hole is filled with the second resistance variable material, FIG. 11(c) is a cross-sectional view showing a step of forming the second resistance variable layer inside the through-hole such that a surface of the interlayer insulating layer and a portion of a side wall of the through-hole are exposed, and FIG. 11(d) is a cross-sectional view showing a step of forming a second electrode such that the through-hole is filled with the second electrode and forming a second wire such that the second wire covers the second electrode exposed in the opening.

FIG. 13 is step cross-sectional views showing an exemplary method of manufacturing the resistance variable element according to modification example 4 of Embodiment 1 of the present invention, in which FIG. 13(a) is a cross-sectional view showing a step of forming the first wire, the first electrode, the first resistance variable layer, the interlayer insulating layer and the through-hole, on the substrate, FIG. 13(b) is a cross-sectional view showing a step of forming the second resistance variable layer inside the through-hole, FIG. 13(c) is a cross-sectional view showing a step of forming the second electrode, and FIG. 13(d) is a cross-sectional view showing a step of forming an insulating layer and forming the second wire such that the second wires covers the second resistance variable layer, the second electrode and the insulating layer, which are exposed in the opening.

FIG. 14 is views showing an exemplary schematic configuration of a memory cell according to Embodiment 2 of the present invention, in which FIG. 14(a) is a plan view, FIG. 14(b) is a cross-sectional view taken in the direction of arrow along line B-B' in FIG. 14(a), and FIG. 14(c) is a cross-sectional view taken in the direction of arrow along line C-C' in FIG. 14(a).

FIG. 16 is step cross-sectional views showing an exemplary method of manufacturing a memory cell according to Embodiment 2 of the present invention, in which FIG. 16(a) is a cross-sectional view showing a step of forming the first wire on the substrate, FIG. 16(b) is a cross-sectional view showing a step of stacking the first electrode material and the first resistance variable material on the first wire, FIG. 16(c) is a cross-sectional view showing a step of completing the first electrode and the first resistance variable layer, and FIG. 16(d) is a cross-sectional view showing a step of forming the interlayer insulating layer such that the interlayer insulating layer covers the first electrode and the first resistance variable layer.

FIG. 17 is step cross-sectional views showing an exemplary method of manufacturing the memory cell according to Embodiment 2 of the present invention, in which FIG. 17(a) is a cross-sectional view showing a step of forming the through-hole in the interlayer insulating layer, FIG. 17(b) is a cross-sectional view showing a step of stacking the second resistance variable material and the second electrode material such that the through-hole is filled with the second resistance variable material and the second electrode material, FIG. 17(c) is a cross-sectional view showing a step of exposing the interlayer insulating layer, and FIG. 17(d) is a cross-sectional view showing a step of forming the current controlling element and the second wire such that the current controlling element and the second wire cover the second resistance variable layer and the second electrode which are exposed in the opening of the through-hole.

FIG. 20 is cross-sectional views showing an exemplary schematic configuration of the resistance variable memory device according to Embodiment 3 of the present invention, in which FIG. 20(a) is a cross-sectional view taken in the direction of arrow along line D-D' in FIG. 19, and FIG. 20(b) is a cross-sectional view taken in the direction of arrow along line E-E' in FIG. 19.

FIG. 25 is step cross-sectional views showing an exemplary method of manufacturing the resistance variable element and a memory cell according to Embodiment 4 of the present invention, in which FIG. 25(a) is a cross-sectional view showing a step of forming the first wire, the first electrode, the first resistance variable layer, the etching stopper layer and the interlayer insulating layer, on the substrate, FIG. 25(b) is a cross-sectional view showing a step of forming the through-hole in the interlayer insulating layer, FIG. 25(c) is a cross-sectional view showing a step of forming the through-hole in the etching stopper layer, and FIG. 25(d) is a cross-sectional view showing a step of forming the second resistance variable layer, the second electrode, the current controlling element and the second wire.

FIG. 26 is views showing an exemplary schematic configuration of a resistance variable element 600 according to Embodiment 5 of the present invention, in which FIG. 26(a) is a cross-sectional view and FIG. 26(b) is a plan view. FIG. 26(a) is a cross-sectional view taken in the direction of arrow along line A-A' in FIG. 26(b).

FIG. 27 is views showing an exemplary schematic configuration of a memory cell 700 according to Embodiment 5 of the present invention, in which FIG. 27(a) is a cross-sectional view and FIG. 27(b) is a plan view. FIG. 27(a) is a cross-sectional view taken in the direction of arrow along line A-A' in FIG. 27(b).

DESCRIPTION OF EMBODIMENTS

Hereinafter, embodiments of the present invention will be described with reference to the drawings.

Embodiment 1

Element Configuration

Figure 1:
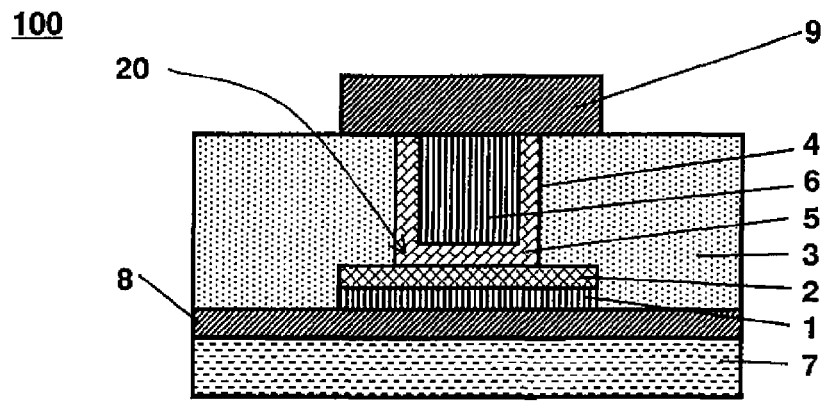
Figure 1:
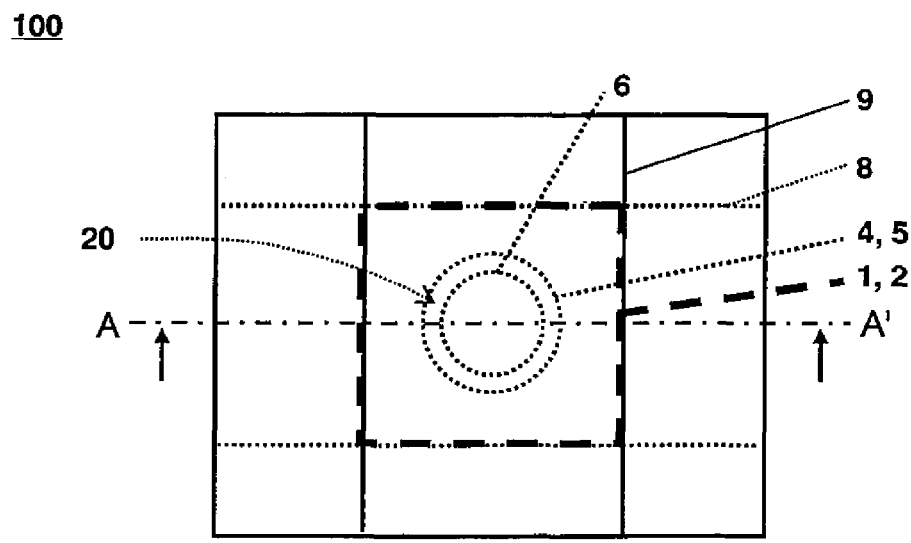

FIG. 1 is a view showing an exemplary schematic configuration of a resistance variable element 100 according to Embodiment 1 of the present invention, in which FIG. 1(a) is a cross-sectional view and FIG. 1(b) is a plan view. FIG. 1(a) is a cross-sectional view taken in the direction of arrow along line A-A' in FIG. 1(b).

As shown in FIG. 1, the resistance variable element 100 includes an interlayer insulating layer 3 (insulating layer) formed between a first wire 8 and a second wire 9, and has a structure in which a through-hole 4 penetrates the interlayer insulating layer 3, a first resistance variable layer 2 comprising transition metal oxide is formed outside the through-hole 4, a second resistance variable layer 5 comprising transition metal oxide is formed inside the through-hole 4, the first resistance variable layer 2 is different in resistivity from the second resistance variable layer 5, and the first resistance variable layer 2 and the second resistance variable layer 5 are in contact with each other only in one opening 20 of openings of the through-hole.

In such a configuration, a layer-stacked structure of a resistance variable layer can be implemented easily in a through-hole cross-point structure memory device.

The phrase "the first resistance variable layer 2 and the second resistance variable layer 5 are in contact with each other only in one of the openings of the through-hole 4" is meant to include a case where a height (distance from a substrate main surface, the same occurs hereinafter) of a surface at which the first resistance variable layer 2 contacts the second resistance variable layer 5 is different from a height of a surface at which the interlayer insulating layer 3 contacts the first resistance variable layer 2, which lies within a plane parallel to the substrate main surface. To be specific, as explained later, in a case where the through-hole 4 is formed by etching using an etching gas containing a fluorine compound gas, degradation of the first resistance variable layer 2 may be problematic. When such a problem is addressed by etching-back a degraded portion of the first resistance variable layer 2, a surface at which the first resistance variable layer 2 contacts the second resistance variable layer 5 swells toward the first resistance variable layer 2. This embodiment includes such a configuration. It should be noted that, preferably, as shown in FIG. 1, the surface at which the first resistance variable layer 2 contacts the second resistance variable layer 5 is coplanar with the surface at which the interlayer insulating layer 3 contacts the first resistance variable layer 2, which surface lies within the plane parallel to the substrate main surface.

In the resistance variable element 100, it is preferable that the first resistance variable layer 2 covers the entire of the opening 20 and protrudes outward over the opening 20, when viewed from a thickness direction of the interlayer insulating layer 3, while the second resistance variable layer 5 covers the entire of the opening 20 and does not protrude outward over the opening 20, when viewed from the thickness direction of the interlayer insulating layer 3.

In such a configuration, the first resistance variable layer 2 completely covers the second resistance variable layer 5 in one of the openings of the through-hole 4, and the second resistance variable layer 5 does not contact a first electrode 1 provided outside the through-hole 4. Therefore, the operation of the resistance variable element 100 is stabilized.

In accordance with this configuration, a layer-stacked structure of the resistance variable layer including the first resistance variable layer 2 and the second resistance variable layer 5 is formed only inside a region defined by one of the openings of the through-hole 4. An area of the stacked portion of the resistance variable layer in each resistance variable element is determined by one of the openings of the through-hole 4. By improving a processing precision of the through-hole 4, a variation in initial resistance values of the resistance variable element 100 can be reduced. As a result, a characteristic variation between resistance variable elements 100 can be reduced.

The resistance variable element 100 further includes the first electrode 1. The first resistance variable layer 2 is formed between the first electrode 1 and the interlayer insulating layer 3, and a second electrode 6 is formed on the second resistance variable layer 5 inside the through-hole 4. By an applying electric pulse between the first electrode 1 and the second electrode 6, an electric resistance between the first electrode 1 and the second electrode 6 changes, and the changed electric resistance is maintained after application of the electric pulses ends.

The phrase "the second electrode 6 is formed on the second resistance variable layer 5 inside the through-hole 4" is meant to include a case where the second electrode 6 is present inward relative to the second resistance variable layer 5, in a bottom region and a side wall of the through-hole 4, or in the bottom region or the side wall of the through-hole 4. The resistance variable element 100 is a so-called nonvolatile memory element.

In this embodiment, the first electrode 1 is formed on the first wire 8 formed on the substrate 7. A second wire 9 is formed to cover the second resistance variable layer 5 and the second electrode 6 exposed in an upper opening of the through-hole 4.

A specific configuration of each constituent in this embodiment may be as follows.

The substrate 7 is provided with a circuit including transistors. The substrate 7 may be a silicon substrate electrically connected to a memory array by means of internal wires (It should be noted that a substrate surface which the first wire 8 contacts must be electrically insulative to prevent adjacent first wires 8 from being electrically shorted). The first electrode 1 and the second electrode 6 may comprise metal such as Al, Cu, Ti, W, Pt, Ir, Cr, Ni, or Nb, a mixture of these (alloy), electrically conductive compound such as TiN, TiW, TaN, $TaSi_2$, TaSiN, TiAlN, NbN, WN, $RuO_2$, $In_2O_3$, $SnO_2$, or $IrO_2$, or a layer-stacked structure of these. The interlayer insulating layer 3 may comprise, for example, a silicon oxide (e.g., $SiO_2$), or the like.

The first resistance variable layer 2 and the second resistance variable layer 5 preferably comprise an electrically conductive transition metal oxide (material formed by oxidizing metal consisting of one or more elements, which is/are selected from transition metals. The fact that such transition metal oxides are suitable for use as the resistance variable material is disclosed in non-patent literature 1 or patent literature 2 and will not be described in detail. The phrase "the first resistance variable layer 2 and the second resistance variable layer 5 comprise transition metal oxide" does not mean that they do not include a material other than the transition metal oxide, but means that they may include materials other than the transition metal oxide or impurities, so long as the resistance variable element 100 has a resistance changing characteristic required for the resistance variable element 100 to operate as the memory element.

Each of the transition metal oxide of the first resistance variable layer 2 and the transition metal oxide of the second resistance variable layer 5 is preferably oxide of at least one transition metal selected from a group consisting of Ta, Hf, and Zr.

Each of the transition metal oxide of the first resistance variable layer 2 and the transition metal oxide of the second resistance variable layer 5 is preferably an oxygen-deficient oxide. The oxygen-deficient oxide refers to an oxide in which an oxygen content (atom ratio: ratio of an oxygen atom number to a total atom number) is less than that of a stoichiometric oxide.

The transition metal oxide of the first resistance variable layer 2 and the transition metal oxide of the second resistance variable layer 5 are selected such that their resistivities are different from each other. The resistivity of the transition metal oxide with a lower resistance, of transition metal oxide of the first resistance variable layer 2 and the transition metal oxide of the second resistance variable layer 5, is, for example, several mΩcm.

The transition metal oxide of the first resistance variable layer 2 and the transition metal oxide of the second resistance variable layer 5 may be tantalum oxides. Preferably, when one of the tantalum oxides is expressed as $TaO_x$, $0.8 \leq x \leq 1.9$ is satisfied, while when the other tantalum oxide is expressed as $TaO_y$, $x<y$ is satisfied. The thickness of $TaO_y$ is preferably about 1~8 nm.

In this case, $TaO_x$ has a lower resistivity (becomes a low-resistance variable layer) and $TaO_y$ has a higher resistivity (becomes a high-resistance variable layer). In such a configuration, a resistance variable element having a rewrite characteristic which is high-speed, reversible and stable, and a good resistance value retention characteristic is attained. An experimental result from which such a finding is derived is described in patent literature 2 and will not be described in detail.

The transition metal oxide of the first resistance variable layer 2 and the transition metal oxide of the second resistance variable layer 5 may be hafnium oxides. Preferably, when one of the hafnium oxides is expressed as $HfO_x$, $0.9 \leq x \leq 1.6$ may be satisfied, while when the other hafnium oxide is expressed as $HfO_y$, $1.8<y$ may be satisfied. The thickness of $HfO_y$ is preferably about 3~4 nm.

The transition metal oxide of the first resistance variable layer 2 and the transition metal oxide of the second resistance variable layer 5 may be zirconium oxides. Preferably, when one of the zirconium oxides is expressed as $ZrO_x$, $0.9 \leq x \leq 1.4$ may be satisfied, while when the other zirconium oxide is expressed as $ZrO_y$, $1.9<y$ may be satisfied. The thickness of $ZrO_y$ is preferably about 1~5 nm.

In the oxides of tantalum, hafnium, and zirconium, the resistivity is higher as the oxygen content is higher.

The oxides of tantalum, hafnium, and zirconium may be deposited by reactive sputtering in which sputtering is performed in a sputtering gas containing oxygen gas using a tantalum target, a hafnium target, and a zirconium target, respectively. By changing the oxygen concentration of the sputtering gas, oxygen contents (resistivities) of respective oxides can be made different. The oxides of tantalum, hafnium, and zirconium may be deposited by CVD or ALD (atomic layer deposition).

The first resistance variable layer 2 and the second resistance variable layer 5 may comprise any of perovskite (In general, a material having a perovskite crystal structure having a composition of $ABX_3$. In general, when X is oxygen or fluorine, A may be a material having an atomic size of 1.0~1.4 Å and B may be a material having an atomic size of 0.45~0.75 Å) such as $SrRuO_3$ (SRO), $Pr_{0.7}Ca_{0.3}MnO_3$, $Pr_{0.5}Ca_{0.5}MnO_3$, and other PCMO, or an oxide with a low activation energy such as $RuO_x$ or $CuO_x$.

The first resistance variable layer 2 and the second resistance variable layer 5 may be such that one of them comprises an electrically conductive metal oxide and the other comprises an insulator comprising an oxide. Specific examples of the insulator comprising the oxide may be various metal oxides such as $Ta_2O_5$, $Al_2O_3$, $Ta_2O_5$, $HfO_2$, or $ZrO_2$. In this case, by controlling the thickness of the insulator, a so-called initialization step (step of applying an electric stress to the resistance variable element to make its resistance state change feasible) is unnecessary and a value of a current flowing through the resistance variable element can be controlled. An experimental result from which such a finding is derived is described in detail in non-patent literature 1 or patent literature 3 and will not be described.

Alternatively, by controlling the thickness of the insulator, a variation in resistance changing characteristics of the resistance variable elements may be suppressed by an initialization step.

The resistivity of the transition metal oxide of the first resistance variable layer 2 may be lower than the resistivity of the transition metal oxide of the second resistance variable layer 5. In such a configuration, since the first resistance variable layer 2 is originally in a reduced state (oxygen content is low), it is less affected by a fluorine-containing gas or the like during etching. Therefore, degradation of the first resistance variable layer due to etching of the through-hole is less likely to occur.

In the example of FIG. 1, the first wire 8 is formed between the first electrode 1 and the substrate 7, and the second wire 9 is formed on the second electrode 6. The first wire 8 and the first electrode 1 may be an identical constituent.

Figure 2:
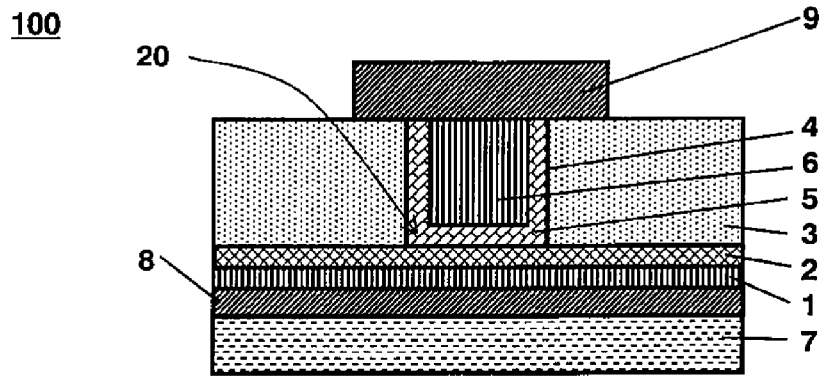
FIG. 2(a) and FIG. 2(b) are cross-sectional views showing exemplary schematic configurations of resistance variable elements according to modification example 1 and modification example 2 of Embodiment 1 of the present invention, respectively.
Figure 2:
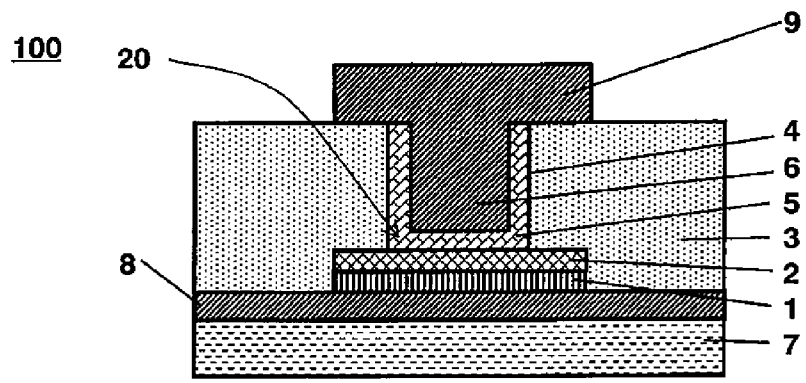

As can be seen from modification example 1 in FIG. 2(a), the first electrode 1 and the first resistance variable layer 2 may cover the entire first wire 8 from above. In this case, since a mask for determining the shapes of the first electrode 1 and the first resistance variable layer 2 may be dispensed with (using a mask for determining the shape of the first wire 8, the first wire 8, the first electrode 1 and the first resistance variable layer 2 are processed concurrently), manufacturing steps can be simplified.

The second wire 9 and the second electrode 6 may be an identical constituent (see modification example 2 of FIG. 2(b)). This configuration may be implemented in such a manner that after a material of the second electrode 6 covers a surface of the substrate provided with the second resistance variable layer 5 inside the through-hole 4 by CVD, plating, etc, the material of the second electrode 6 formed over the entire substrate surface is processed into the second wire 9, by etching or the like, when forming the second electrode 6.

The first electrode 1 and the second electrode 6 may be each composed of a plurality of layers. Preferably, the first resistance variable layer 2 and the second resistance variable layer 5 are in contact with other in completely entire opening 20 of the through-hole.

The configuration of the resistance variable element 100 will be described below in more detail with reference to FIG. 1.

The resistance variable element 100 has the first wire 8 of a band shape and a specified width, which is formed on the substrate 7. On the first wire 8, the first electrode 1 and the first resistance variable layer 2 are stacked together in this order such that the first electrode 1 and the first resistance variable layer 2 do not protrude outward from the first wire 8, when viewed from a thickness direction of the substrate 7. The first electrode 1 and the first resistance variable layer 2 have the same shape when viewed from the thickness direction of the substrate 7. The phrase "first electrode is formed on the substrate" includes a case where the first electrode is formed to physically contact the substrate and a case where the first electrode is formed above the substrate via another member (e.g., first wire 8), which is a general interpretation.

Over the substrate 7, the interlayer insulating layer 3 is formed to cover the first wire 8, the first electrode 1, and the first resistance variable layer 2. In the interlayer insulating layer 3 above the first resistance variable layer 2, the tubular through-hole 4 penetrates the interlayer insulating layer 3 and reaches the upper surface of the first resistance variable layer 2. Inside the through-hole 4, the second resistance variable layer 5 is formed to cover the entire bottom region and entire surface of a side wall of the through-hole 4. The second resistance variable layer 5 does not completely fill the through-hole 4 but the second electrode 6 completely fills a gap (recess) defined by the second resistance variable layer 5. The "interlayer insulating layer" may be an interlayer insulating layer formed by a single step or a joint layer composed of a plurality of interlayer insulating layers formed in a plurality of steps.

In the upper opening of the through-hole 4, the second resistance variable layer 5 and the second electrode 6 are exposed. The second wire 9 of a band shape and with a specified width is formed to extend in a direction orthogonal to the first wire 8 when viewed from the thickness direction of the substrate 7 such that the second wire 9 covers the entire upper region of the opening and protrudes outward over the upper opening.

The resistivity of the transition metal oxide of the first resistance variable layer 2 may be set lower than the resistivity of the transition metal oxide of the second resistance variable layer 5. To be specific, when tantalum oxide is used as the transition metal oxide of the first resistance variable layer 2 and its composition is expressed as $TaO_x$, $0.8 \leq x \leq 1.9$ is satisfied, while when the tantalum oxide is used as the transition metal oxide of the second resistance variable layer 5 and its composition is expressed as $TaO_y$, $x<y$ is satisfied. To be specific, for example, when x=0.8 and y=2.48, the resistivity of the first resistance variable layer is 0.6 Ωcm and the resistivity of the second resistance variable layer cannot be measured by a meter.

In such a configuration, preferably, the thickness of first electrode 1 is not less than 10 nm and not more than 50 nm, the thickness of the first resistance variable layer 2 (low-resistance variable layer) is not less than 10 nm and not more than 50 nm, and the thickness of the second resistance variable layer 5 (high-resistance variable layer) is not less than 1 nm and not more than 8 nm in a thinnest portion of the bottom surface.

[Manufacturing Method]

Figure 3:
Figure 3:
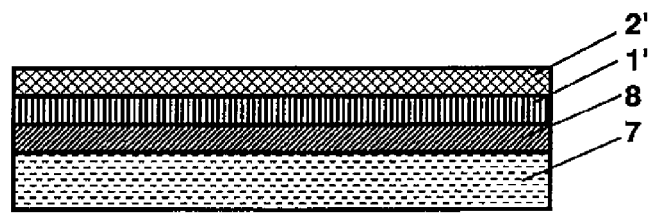
Figure 3:
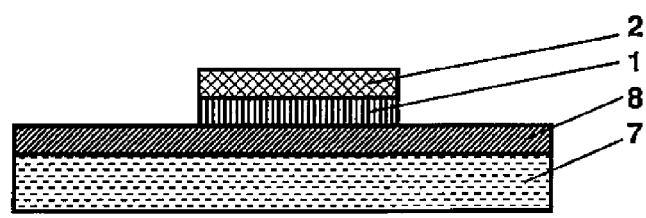
Figure 3:
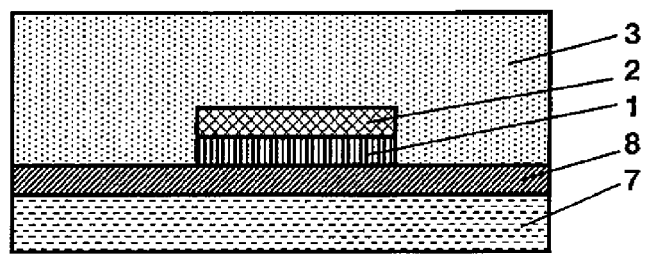
Figure 4:
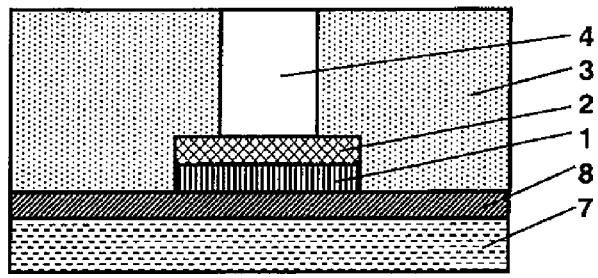
Figure 4:
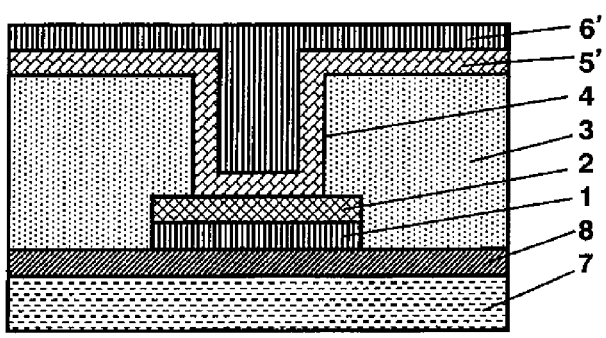
Figure 4:
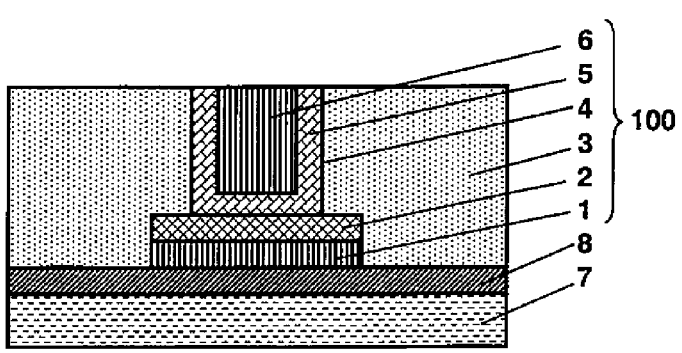
Figure 4:
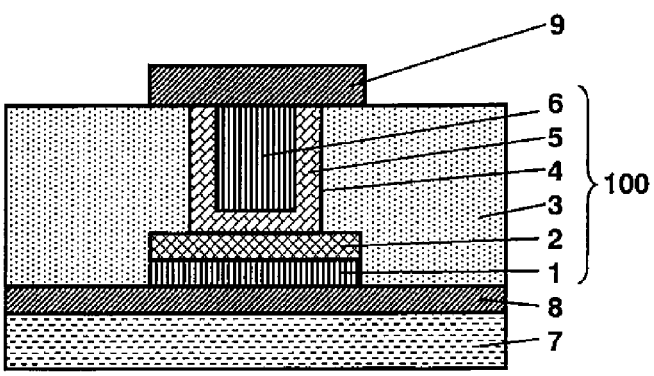

FIGS. 3 and 4 are step views showing an exemplary method of manufacturing the resistance variable element according to Embodiment 1 of the present invention. FIG. 3(a) is a view showing a step of forming the first wire 8 on the substrate 7, FIG. 3(b) is a view showing a step of stacking a first electrode material layer 1' and a first resistance variable material layer 2' on the first wire 8, FIG. 3(c) is a view showing a step of completing the first electrode 1 and the first resistance variable layer 2, and FIG. 3(d) is a view showing a step of forming the interlayer insulating layer 3 such that the interlayer insulating layer 3 covers the first electrode 1 and the first resistance variable layer 2. FIG. 4(a) is a view showing a step of forming the through-hole 4 in the interlayer insulating layer 3. FIG. 4(b) is a view showing a step of stacking a second resistance variable material layer 5' and a second electrode material layer 6' such that the through-hole 4 is filled with the second resistance variable material layer 5' and the second electrode material layer 6'. FIG. 4(c) is a view showing a step of removing the second resistance variable material layer 5' and the second electrode material layer 6' on the surface of the interlayer insulating layer 3 to expose the surface of the interlayer insulating layer 3. FIG. 4(d) is a view showing a step of forming the second wire 9 such that the second wire 9 covers the second resistance variable layer 5 and the second electrode 6 which are exposed in the other opening of the through-hole 4.

As shown in FIGS. 3 and 4, the manufacturing method of the resistance variable element of this embodiment includes a first wire forming step of forming the first wire 8 on the substrate, a first electrode forming step of forming the first electrode 1 on the first wire 8, a first resistance variable layer forming step (e.g., FIGS. 3(a) to 3(c)) of forming the first resistance variable layer 2 comprising the transition metal oxide on the first electrode 1, an interlayer insulating layer forming step (e.g., FIG. 3(d)) of forming the interlayer insulating layer 3 on the first resistance variable layer 2, a through-hole forming step (e.g., FIG. 4(a)) of forming the through-hole 4 on the first resistance variable layer 2 such that the through-hole 4 penetrates the interlayer insulating layer 3, a second resistance variable layer forming step of forming the second resistance variable layer 5 comprising the transition metal oxide and having a resistivity (oxygen content) different from that of the first resistance variable layer 2 such that the second resistance variable layer 5 contacts the first resistance variable layer 2 only in the opening 20 of the through-hole 4 inside the through-hole 4, a second electrode forming step of forming the second electrode 6 on the second resistance variable layer 5 inside the through-hole, and a second wire forming step (FIG. 4(b) to FIG. 4(d)) of forming the second wire 9 on the other opening of the through-hole 4 filled with the second resistance variable layer 5 and the second electrode 6.

Preferably, the first resistance variable layer 2 covers the entire of the opening 20 of the through-hole 4 and protrudes outward over the opening 20. In such a configuration, even if a displacement occurs between the through-hole 4 and the first resistance variable layer 2 and a portion of the opening 20 of the through-hole 4 protrudes outwards from the first resistance variable layer 2, a direct contact of the second resistance variable layer 5 and the first electrode 1 can be inhibited, and a stable operation can be achieved.

The first electrode forming step and the first resistance variable layer forming step in the examples shown in FIGS. 3 and 4, are made as an identical step, and may be performed by using a co-sputtering apparatus. Likewise, the second electrode forming step and the second resistance variable layer forming step are made as an identical step.

The manufacturing method of the resistance variable element 100 will be described below in detail with reference to FIGS. 3 and 4.

Initially, as shown in FIG. 3(*a*), a wire material such as aluminum (Al) is deposited over the substrate 7 by sputtering, and etched, thereby forming the first wire 8 of the band shape and with the specified width (first wire forming step).

Then, as shown in FIG. 3(*b*), over the first wire 8, the first electrode material 1' such as tantalum (Ta), titanium (Ti), or Al, is deposited in 10~50 nm thickness by sputtering (first electrode material deposition step), and then the first resistance variable material 2' comprising $TaO_x$ ($0.8 \leq x \leq 1.9$) is deposited in 10~50 nm thickness by the reactive sputtering, CVD, or the like (first resistance variable material deposition step).

Then, as shown in FIG. 3(*c*), by a photolithography process and an etching process, the first resistance variable layer 2 is formed (first resistance variable layer etching step), and successively, the first electrode 1 is formed by etching (first electrode etching step).

Then, as shown in FIG. 3(*d*), the interlayer insulating layer 3 is deposited to cover the substrate 7, the first wire 8, the first electrode 1, and the first resistance variable layer 2, and a surface of the interlayer insulating layer 3 is planarized by CMP, or the like (interlayer insulating layer forming step).

Then, as shown in FIG. 4(*a*), by a photolithography process and an etching process, the through-hole 4 is formed to penetrate the interlayer insulating layer 3 and open in the surface of the first resistance variable layer 2 (through-hole forming step).

Then, as shown in FIG. 4(*b*), the second resistance variable material 5' comprising $TaO_y$ ($x<y$) is deposited in 1~8 nm thickness by CVD so as to cover the upper surface of the interlayer insulating layer 3 and the entire bottom region and the entire surface of the side wall of the through-hole 4. Further, the second electrode material 6' such as platinum (Pt), iridium (Ir), palladium (Pd), tungsten (W), or tantalum nitride (TaN) is deposited, to completely fill the through-hole 4.

Then, as shown in FIG. 4(*c*), the second resistance variable material 5' and the second electrode material 6' are removed up to the upper surface of the interlayer insulating layer 3, i.e., to expose the surface of the interlayer insulating layer 3 except for the other opening of the through-hole 4, by CMP. Thereby, a layer-stacked structure of the second resistance variable layer 5 and the second electrode 6 is formed to completely fill the through-hole 4 (interlayer insulating layer exposing step).

Then, as shown FIG. 4(*d*), a wire material such as A1 is deposited by sputtering to cover the second resistance variable layer 5 and the second electrode 6 which are exposed in the other opening of the through-hole 4, and the second wire 9 of a band shape and with a specified width is formed by the photolithography process and the etching process (second wire forming step).

Through the above steps, the resistance variable element 100 is attained.

The deposition method of the electrode material is not limited to sputtering (hereinafter, the same applies to all embodiments and modification examples). For example, CVD, vapor deposition, plating, or other method may be used.

The deposition method of the resistance variable material is not limited to CVD. For example, sputtering or ALD (atomic layer deposition) may be used (hereinafter, the same applies to all embodiments and modification examples).

To planarize the surface of the interlayer insulating layer, a so-called etch back process may be used as well as the above mentioned CMP (hereinafter, the same applies to all embodiments and modification examples).

The deposition method of the wire material is not limited to sputtering (hereinafter, the same applies to all embodiments and modification examples). For example, when Cu or the like is used as the wire material, stripe-shaped wires may be formed by a damascene process (a wire trench is formed preliminarily in an insulating layer such as a substrate, an electrically conductive layer (Cu or the like) for forming wires is deposited on the insulating layer and into the wire trench, and then the electrically conductive layer is polished by CMP (chemical mechanical polishing) such that the electrically conductive layer is left only inside the wire trench).

[Operation]

Figure 5:
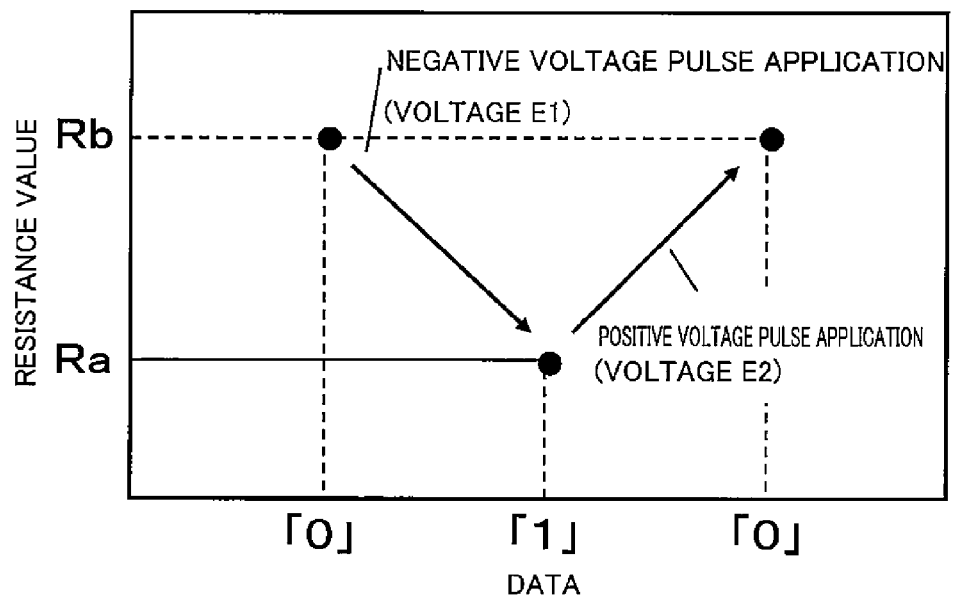
FIG. 5 is a view showing a change in resistance values occurring when electric pulses are applied to the resistance variable element 100.

FIG. 5 is a view showing a relationship between a change in resistance values and the corresponding data when electric pulses are applied to the resistance variable element 100. It is supposed that a voltage and a polarity of the electric pulse are determined by an electric potential of the second electrode 6 on the basis of the first electrode 1. Applying the electric pulses to the resistance variable element 100 refers to applying electric pulses with predetermined polarity voltages and pulse widths between the first electrode 1 and the second electrode 6.

As shown in FIG. 5, two kinds of electric pulses (negative voltage pulse E1 and positive voltage pulse E2) with different polarities are applied alternately between the first wire 8 and the second wire 9, the resistance values (electric resistance values between the first electrode 1 and the second electrode 6) of the resistance variable element 100 change. By application of the electric pulse (hereinafter this voltage is referred to as E1) of a negative voltage which is higher in voltage than a first threshold voltage, the resistance value decreases to a low-resistance value Ra. By application of the electric pulse (hereinafter this voltage is referred to as E2) of a positive voltage which is higher in voltage than a second threshold voltage, the resistance value increases to a high-resistance value Rb. The resistance variable element 100 can be used as a nonvolatile memory element, because the electric resistances between the first electrode 1 and the second electrode 6 change by application of the electric pulses between the first electrode 1 and the second electrode 6, and the changed electric resistances are maintained after application of the electric pulses ends.

The resistance variable element 100 has a bipolar characteristic. To be specific, by application of an electric pulse with a first polarity voltage (e.g., electric pulse with a positive voltage), the resistance variable element 100 changes to a first resistance state (e.g., high-resistance state), while by application of an electric pulse with a second polarity different from the first polarity (e.g., electric pulse with a negative voltage), the resistance variable element 100 changes to a second resistance state (e.g., low-resistance state).

Figure 6:
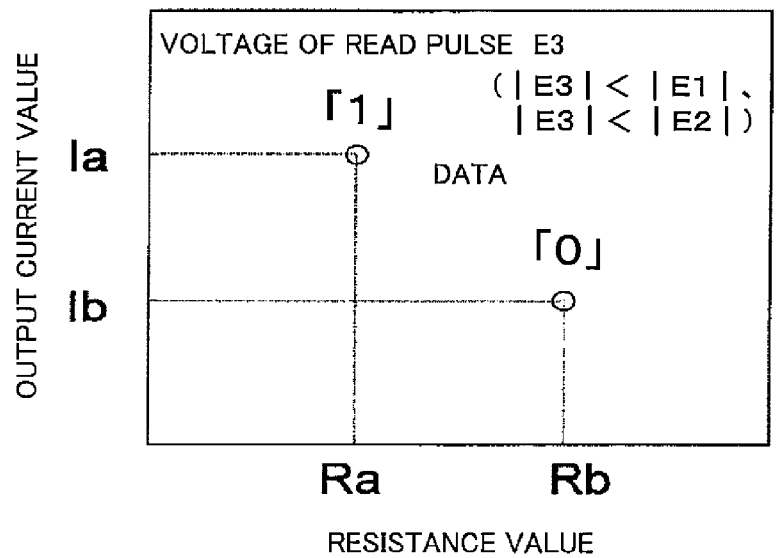
FIG. 6 is a schematic view showing a method of reading stored data based on the resistance values of the resistance variable element 100.

FIG. 6 is a schematic view showing a method of reading stored data based on resistance values of the resistance variable element 100.

As shown in FIG. 6, it is assumed that one of two different resistance values Ra and Rb is data "0" and the other is data "1". In this way, one bit data ("0" or "1") can be stored to correspond to the resistance value. In the example shown in FIG. 6, the resistance value Rb (high-resistance state) is allocated to the data "0" and the resistance value Ra (low-resistance state) is allocated to the data "1".

As shown in FIG. 6, by application of the electric pulse of the negative voltage in a state where the resistance variable element 100 is in the high-resistance state (resistance value is Rb), the resistance variable element 100 changes to the low-resistance state (resistance value is Ra). Thereby, the data stored in the resistance variable element 100 is rewritten from "0" to "1".

By application of the electric pulse of the positive voltage in a state where the resistance variable element 100 is in the low-resistance state (resistance value is Ra), the resistance variable element 100 changes to the low-resistance state (resistance value is Rb). Thereby, the data stored in the resistance variable element 100 is rewritten from "1" to "0".

When the data stored in the resistance variable element 100 is read, a read pulse voltage E3 which is smaller in absolute value than the electric pulse (voltage E1 or voltage E2) applied to change the resistance state of the resistance variable element 100 and does not change the resistance value of the resistance variable element 100, is applied to the resistance variable element 100, thereby reading an output current value. As shown in FIG. 6, an output current value Ia corresponds to the resistance value Ra and an output current value Ib corresponds to the resistance value Rb. Therefore, the data (data "0" or data "1") stored in the resistance variable element 100 is read, based on the read output current value.

A correspondence between the data and the resistance states, and a correspondence between the polarities of the electric pulses and increase/decrease in the resistance values, etc are not limited to the above but may be suitably set according to a specific resistance variable element configuration.

ADVANTAGES

In accordance with the resistance variable element and the manufacturing method of the resistance variable element of this embodiment, it is possible to easily implement the layer-stacked structure of the resistance variable layer in the through-hole cross-point structure memory device. Two resistance variable layers, i.e., the first resistance variable layer and the second resistance variable layer are stacked together self-alignedly such that the former is formed outside the through-hole and the latter is formed inside the though-hole. For example, as compared to a case where the two resistance variable layers are formed inside the through-hole, the number of layers inside the through-hole is lessened and manufacturing is easier. Design flexibility of compositions and sizes (thicknesses and areas) of respective resistance variable layers is improved. The first resistance variable layer formed outside the through-hole is not constrained by the through-hole. The thickness or the like of the second resistance variable layer formed inside the through-hole can be set comparatively flexibly because the number of layers inside the through-hole is less. The two resistance variable layers can be deposited using CVD, sputtering, ALD (atomic layer deposition), etc while controlling their compositions individually. Such a manufacturing method makes it easier to make the compositions uniform or control the thicknesses of the resistance variable layers than a method in which the resistivity is changed by oxidization using plasma after forming the resistance variable layer. These facts mean that flexibility in a manufacturing process is improved. By setting proper manufacturing process conditions, a likelihood that a resistance variable element which is less in electric characteristic variation and is highly reliable and a memory device including such a resistance variable element can be implemented increases.

The second resistance variable layer and the second electrode are formed self-alignedly inside the through-hole. Therefore, the resistance variable element 100 is suitable for high-dense integration.

A resistance changing portion is limited to a portion (opening of through-hole) sandwiched between the first electrode and the second electrode. In other words, a size of a basic constituent unit of the resistance variable element is determined by the through-hole. Because of this, the basic constituent unit of the resistance variable element can be miniaturized to a minimum size of a process rule of the manufacturing process. In addition, a characteristic variation in the resistance variable elements can be lessened and reliability of the operation is improved.

The first resistance variable layer, the first electrode, the second resistance variable layer and the second electrode can be formed by standard semiconductor process (e.g., mask process for fabricating constituents other than memory element, CMOS process, etc), and thus, a manufacturing process can be simplified.

Since the resistivity of the first resistance variable layer is different from the resistivity of the second resistance variable layer, a resistance variable element with a good characteristic is attained by controlling the compositions and thicknesses of the respective resistance variable layers.

Since the first resistance variable layer and the second resistance variable layer are fabricated independently, it is possible to implement a process which improves a characteristic of the resistance variable element by thermally treating only the first resistance variable layer, which was difficult when a layer-stacked structure is formed by a method of oxidizing a transition metal oxide.

Figure 7:
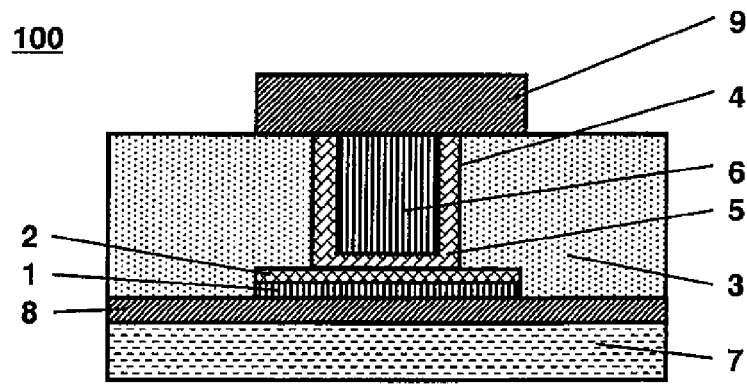
Figure 7:
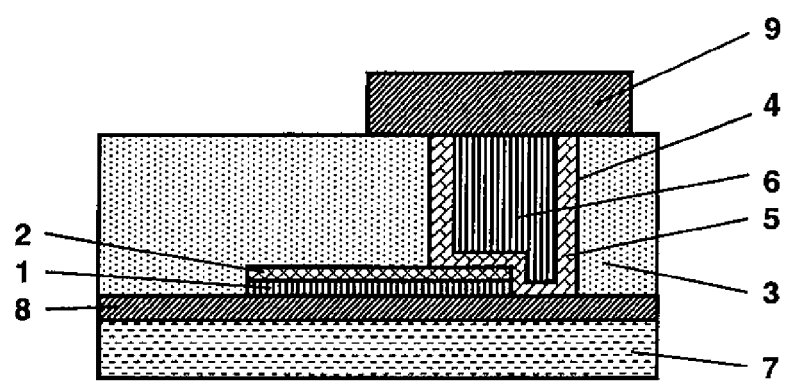

FIG. 7 is views showing a case where the through-hole is displaced with respect to a predetermined location in the resistance variable element according to Embodiment 1 of the present invention, in which FIG. 7(a) shows a case where no displacement occurs and FIG. 7(b) shows a case where a displacement occurs.

Figure 8:
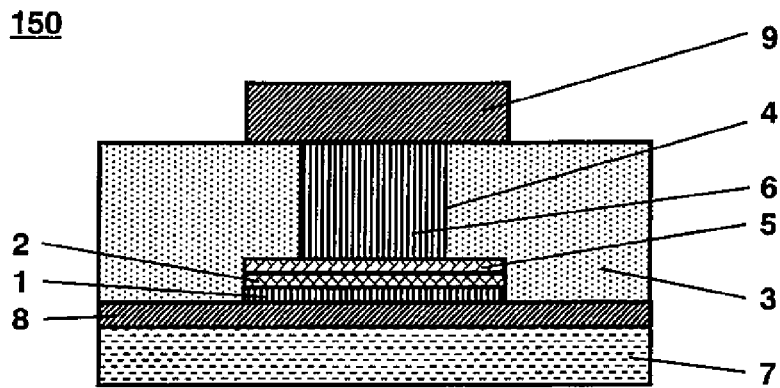
Figure 8:
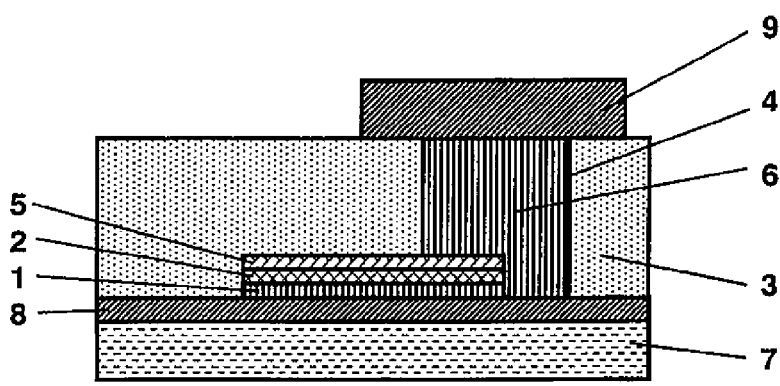

FIG. 8 is views showing a case where the through-hole is displaced with respect to a predetermined location, in a case where the first resistance variable layer 2 and the second resistance variable layer 5 are formed outside the through-hole 4 (on the first electrode 1) and only the electrode is formed inside the through-hole, in which FIG. 8(a) shows a case where no displacement occurs and FIG. 8(b) shows a case where a displacement occurs.

In FIGS. 7 and 8, the constituents designated by the same reference symbols as those in FIG. 1 are the same as those in FIG. 1 and will not be described repetitively.

As shown in FIG. 8, in a resistance variable element 150 in which the first resistance variable layer 2 and the second resistance variable layer 5 are formed outside the through-hole 4 and only the second electrode 6 is formed inside the through-hole 4, if the through-hole 4 is displaced with respect to a predetermined location (FIG. 8(b)), the second electrode 6 and the first wire 8 (or the first electrode 1) are short-circuited, and as a result, the resistance variable element 150 cannot change its resistance.

If a short-circuit occurs in a memory cell as shown in FIG. 8(b), memory cells belonging to the same row and the same column cannot be used. This results in a severe reduction of a memory capacity.

As shown in FIG. 7, in the resistance variable element 100, even if the through-hole 4 is displaced with respect to a predetermined location (FIG. 7(b)), it is possible to suppress the second electrode 6 and the first wire 8 (or the first electrode 1) from being short-circuited, because the entire bottom region of the through-hole 4 and the entire surface of the side wall of the through-hole 4 are covered with the second resistance variable layer 5.

Modification Example 3

Figure 9:
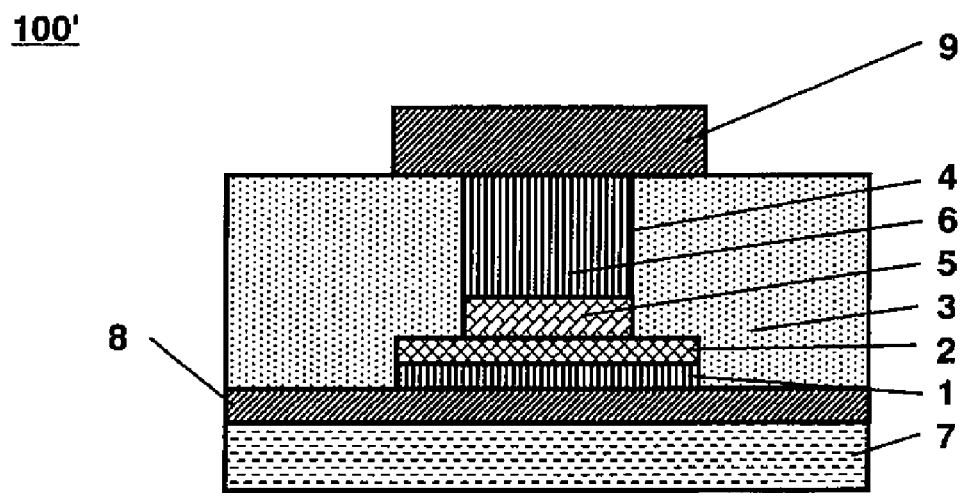
FIG. 9 is a view showing an exemplary schematic configuration of a resistance variable element 100' according to modification example 3 of Embodiment 1 of the present invention.

FIG. 9 is a view showing an exemplary schematic configuration of a resistance variable element 100' according to modification example 3 of Embodiment 1 of the present invention.

As shown in FIG. 9, the resistance variable element 100' has a configuration identical to that of the resistance variable element 100 except for the constituents inside the through-hole 4. Therefore, the same constituents as those in the resistance variable element 100 are designated by the same reference symbols and will not be described repetitively.

Inside the through-hole 4 of the resistance variable element 100', the second resistance variable layer 5 is formed to cover the entire bottom region, and the second electrode 6 is formed on the second resistance variable layer 5. In other words, in the resistance variable element 100', the second resistance variable layer 5 is formed on a portion of the surface of the side wall of the through-hole 4 and the second electrode 6 is in contact with the side wall of the through-hole 4.

Only the second electrode 6 is exposed in the other opening of the through-hole 4. The second wire 9 of a band shape and with a specified width is formed to extend in a direction orthogonal to the first wire 8 when viewed from a thickness direction of the substrate 7 such that the second wire 9 covers the entire upper surface of the second electrode 6 exposed in the opening and protrudes outward over the other opening.

Figure 10:
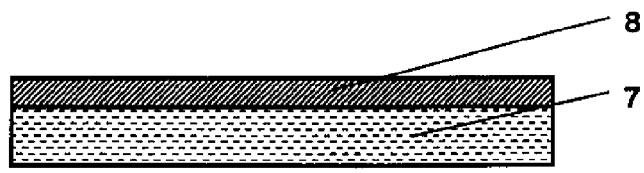
Figure 10:
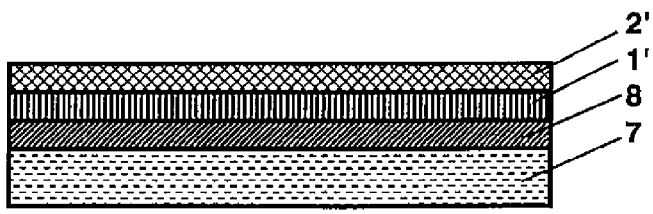
Figure 10:
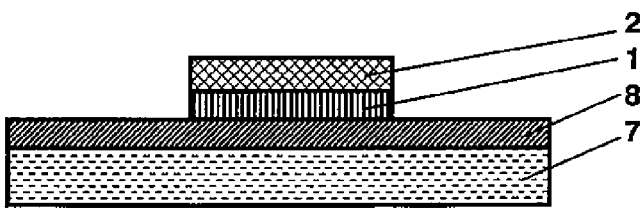
Figure 10:
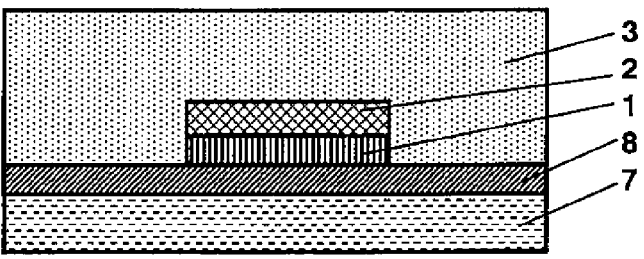
Figure 11:
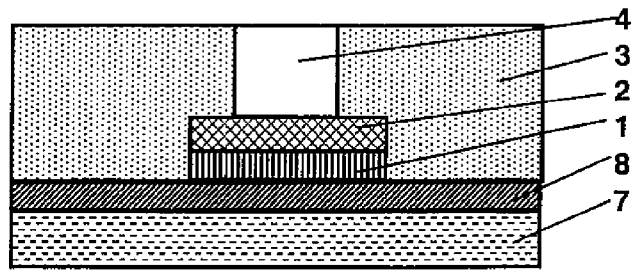
Figure 11:
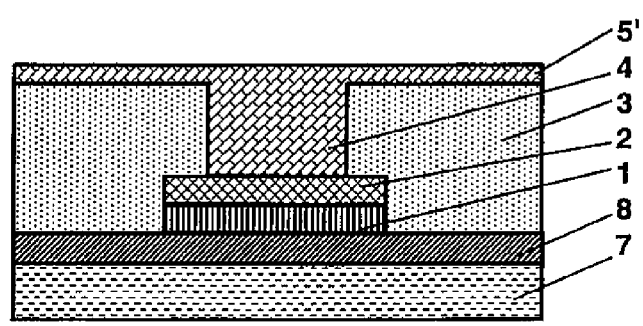
Figure 11:
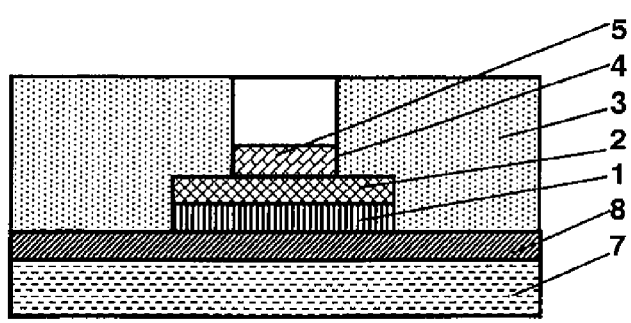
Figure 11:
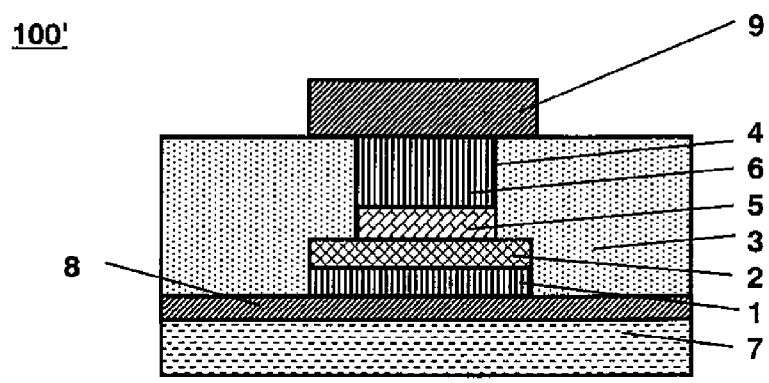

FIGS. 10 and 11 are step views showing an exemplary method of manufacturing the resistance variable element according to modification example 3 of Embodiment 1 of the present invention, in which FIG. 10(a) is a view showing a step of forming the first wire 8 on the substrate 7, FIG. 10(b) is a view showing a step of stacking the first electrode material layer 1' and the first resistance variable material layer 2' on the first wire 8, FIG. 10(c) is a view showing a step of completing the first electrode 1 and the first resistance variable layer 2, and FIG. 10(d) is a view showing a step of forming the interlayer insulating layer 3 such that the interlayer insulating layer 3 covers the first electrode 1 and the first resistance variable layer 2. FIG. 11(a) is a view showing a step of forming the through-hole 4 in the interlayer insulating layer 3, FIG. 11(b) is a view showing a step of depositing the second resistance variable material layer 5' such that the through-hole 4 is filled with the second resistance variable material layer 5', FIG. 11(c) is a view showing a step of exposing the interlayer insulating layer 3 and a portion of the side wall of the through-hole 4, and FIG. 11(d) is a view showing a step of forming the second electrode 6 such that the through-hole 4 is filled with the second electrode 6 and further forming the second wire 9 such that the second wire 9 covers the second electrode 6 exposed in the other opening of the through-hole 4.

The configurations in FIGS. 10(a)~10(d) and FIG. 11(a) are identical to those in FIGS. 3(a)~3(d) and FIG. 4(a) and will not be described repetitively.

As shown in FIG. 11(b), the second resistance variable material 5' comprising, for example, $TaO_y$ (x<y) is deposited over the upper surface of the interlayer insulating layer 3 and inside the through-hole 4, by CVD, thereby completely filling the second resistance variable material 5' into the through-hole 4.

Then, as shown in FIG. 11(c), the second resistance variable material 5' is removed up to the upper surface of the interlayer insulating layer 3, i.e., expose the interlayer insulating layer 3, by CMP (interlayer insulating layer exposing step). In this case, CMP conditions are set so that a speed with which the second resistance variable material 5' is polished is higher than a speed with which the interlayer insulating layer 3 is polished, and a portion of the second resistance variable material 5' inside the through-hole 4 is removed by overpolishing. As a result, a recess is formed inside the through-hole 4. Furthermore, the second resistance variable material 5' inside the through-hole is thinned by etch-back.

Then, as shown in FIG. 11(d), the second electrode 6 is deposited by CVD to fill the recess formed in the through-hole 4. Thereafter, the interlayer insulating layer 3 is exposed by CMP, and the second wire 9 of a band shape and with a specified width is formed by sputtering and etching using a mask, using a wire material such as Al such that the second wire 9 covers the second electrode 6 exposed in the upper opening of the through-hole 4 (second wire forming step).

Through the above steps, the resistance variable element 100' is attained.

Thus, the resistance variable element 100' can easily implement the layer-stacked structure of the resistance variable layer in the through-hole cross-point structure memory device. In this modification example, also, even if the through-hole 4 is displaced with respect to the first electrode 1 and the first resistance variable layer 2, it is possible to suppress the second electrode 6 and the first wire 8 (or the first electrode 1) from being short-circuited.

Modification Example 4

Figure 12:
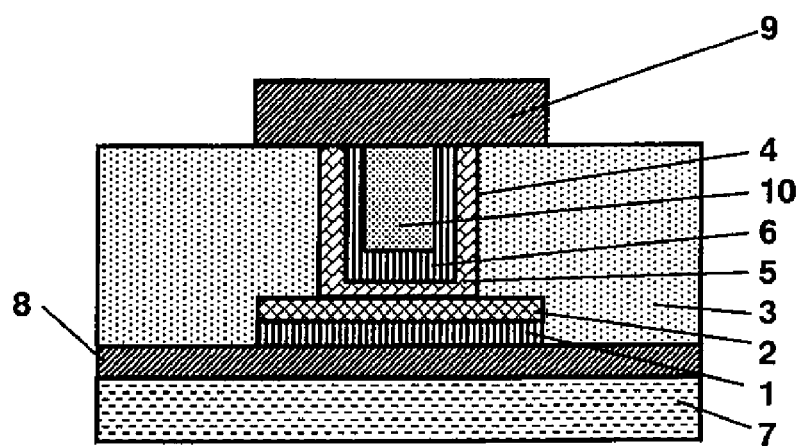
FIG. 12 is a cross-sectional view showing an exemplary schematic configuration of a resistance variable element 100" according to modification example 4 of Embodiment 1 of the present invention.

FIG. 12 is a view showing an exemplary schematic configuration of a resistance variable element 100'' according to modification example 4 of Embodiment 1 of the present invention.

As shown in FIG. 12, the resistance variable element 100'' has a configuration identical to that of the resistance variable element 100 except for the constituents inside the through-hole 4. Therefore, the same constituents as those in the resistance variable element 100 are designated by the same reference symbols and will not be described repetitively.

Inside the through-hole 4 of the resistance variable element 100'', the second resistance variable layer 5 is formed to cover the entire bottom region and the entire surface of the side wall of the through-hole 4. The second resistance variable layer 5 does not completely fill the through-hole 4, and the second electrode 6 is formed to cover an entire bottom surface and entire surface of a side wall of a gap (recess) defined by the second resistance variable layer 5 inside the through-hole 4. The second electrode 6 does not completely fill the gap (recess), and an insulating layer 10 is formed to completely fill a gap (recess) defined by the second electrode 6.

In the other opening of the through-hole 4, the second resistance variable layer 5, the second electrode 6 and the insulating layer 10 are exposed. The second wire 9 of a band shape and with a specified width is formed to extend in a direction orthogonal to the first wire 8 when viewed from a thickness direction of the substrate 7 such that the second wire 9 covers the entire upper region of the other opening and protrudes outward over the upper opening.

Figure 13:
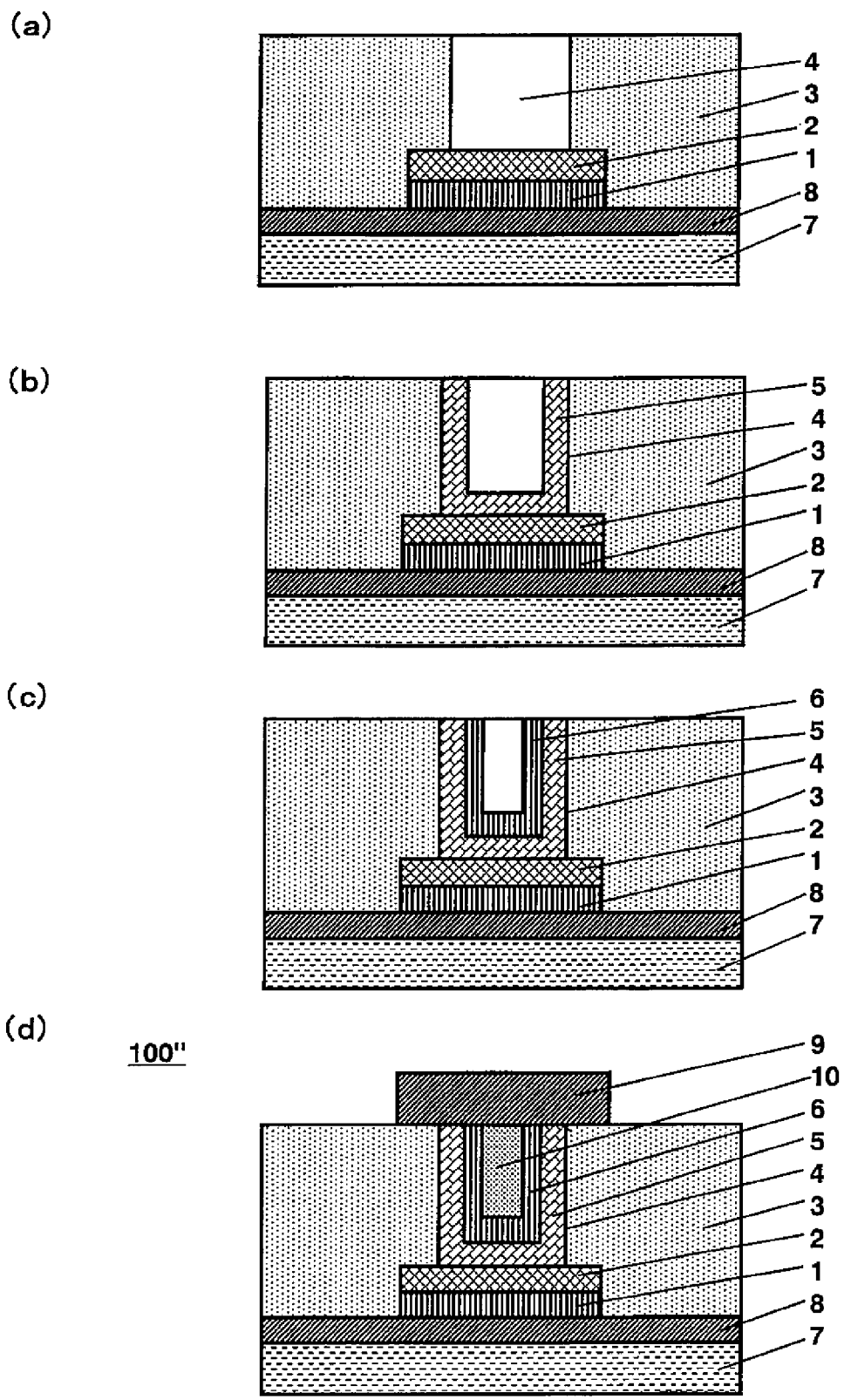

FIG. 13 is a step views showing an exemplary method of manufacturing the resistance variable element according to modification example 4 of Embodiment 1 of the present invention, in which FIG. 13(a) is a view showing a step of forming the first wire 8, the first electrode 1, the first resistance variable layer 2, the interlayer insulating layer 3 and the through-hole 4, on the substrate, FIG. 13(b) is a view showing a step of forming the second resistance variable layer 5 inside the through-hole 4, FIG. 13(c) is a view showing a step of forming the second electrode 6, and FIG. 13(d) is a view showing a step of forming the insulating layer 10 and further forming the second wire 9 such that the second wire 9 covers the second resistance variable layer 5, the second electrode 6 and the insulating layer 10 which are exposed in the other opening of the through-hole 4.

In the step of FIG. 13(a), the first wire 8, the first electrode 1, the first resistance variable layer 2, the interlayer insulating layer 3 and the through-hole 4 are formed on the substrate 7, through the steps shown in FIGS. 3(a)~3(d) and FIG. 4(a).

Then, as shown in FIG. 13(b), a second resistance variable material layer (not shown) comprising $TaO_y$ (x<y) is deposited conformally inside the through-hole 4 by CVD or the like such that the second resistance variable material layer covers the upper surface of the interlayer insulating layer 3, the entire bottom region and entire surface of a side wall of the through-hole 4 and the gap (recess) is formed inside the second resistance variable material layer. Then, the second resistance variable material layer is removed up to the upper surface of the interlayer insulating layer 3, i.e., expose the interlayer insulating layer 3, by CMP. As a result, the second resistance variable layer 5 is formed inside the through-hole 4 such that the second resistance variable layer 5 covers the entire bottom region and entire surface of the side wall of the through-hole 4 and the gap (recess) is formed inside the second resistance variable layer 5 (second resistance variable layer forming step).

Then, as shown in FIG. 13(c), a second electrode material layer (not shown) is deposited over the upper surface of the interlayer insulating layer 3 and inside the gap (recess) defined by the second resistance variable layer 5, by CVD or the like. Following this, the second electrode material layer is removed up to the upper surface of the interlayer insulating layer 3, i.e., expose the interlayer insulating layer 3, by CMP. As a result, the second electrode 6 is formed in the gap (recess) defined by the second resistance variable layer 5 such that the second electrode 6 covers the entire bottom surface and entire surface of a side wall of the gap (recess) defined by the second resistance variable layer 5 and the gap (recess) is formed inside the second electrode 6 (second electrode forming step).

Then, as shown in FIG. 13(d), an insulating material layer (not shown) is deposited over the upper surface of the interlayer insulating layer 3 and inside the gap (recess) of the second electrode 6, by CVD. Following this, the insulating material layer is removed up to the upper surface of the interlayer insulating layer 3, i.e., expose the interlayer insulating layer 3, by CMP. Thereby, the insulating layer 10 is formed to completely fill the gap (recess) (insulating layer forming step). Thereafter, the second wire 9 of a band shape and with a specified width is formed by sputtering and etching using a mask, using a wire material such as Al such that the second wire 9 covers the second resistance variable layer 5, the second electrode 6 and the insulating layer 10 which are exposed in the upper opening of the through-hole 4 (second wire forming step).

Through the above steps, the resistance variable element 100" is attained.

Regarding depositing of the second resistance variable material layer, depositing of the second electrode material layer and depositing of the insulating material layer, two (depositing of the second resistance variable material layer and depositing of the second electrode material layer, or depositing of the second electrode material layer and depositing of the insulating material layer), or all of them, may be carried out successively without inserting the CMP step.

The deposition method of the insulating material layer is not limited to CVD. For example, sputtering or ALD (atomic layer deposition) may be used (hereinafter, the same applies to all embodiments and modification examples).

In the resistance variable element 100", the layer-stacked structure of the resistance variable layer is easily implemented in the through-hole cross-point structure memory device. In modification example 4, even if the through-hole 4 is displaced with respect to the first electrode 1 and the first resistance variable layer 2, it is possible to effectively suppress the second electrode 6 and the first wire 8 (or the first electrode 1) from being short-circuited. Furthermore, in this modification example, since the insulating layer similar to that outside the through-hole is formed inside the through-hole, a stress applied to each portion of the resistance variable element is lessened, and the electrode and the interlayer insulating layer are less likely to peel off. In other words, a mechanical stiffness of the resistance variable element is improved.

Embodiment 2

Element Configuration

Figure 14:
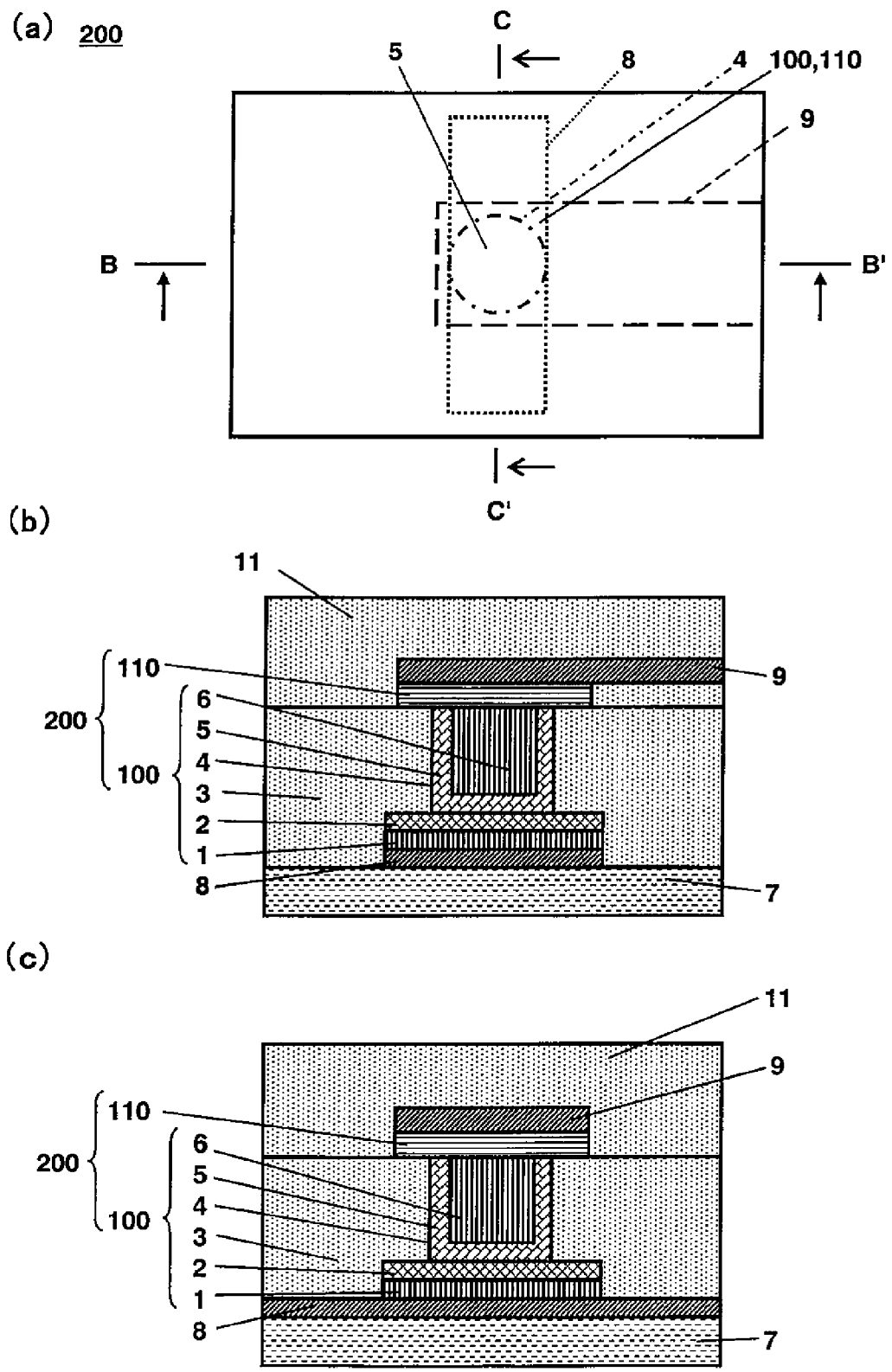

FIG. 14 is a view showing an exemplary schematic configuration of a memory cell according to Embodiment 2 of the present invention, in which FIG. 14(a) is a plan view, FIG. 14(b) is a cross-sectional view taken in the direction of arrow along line B-B' in FIG. 14(a), and FIG. 14(c) is a cross-sectional view taken in the direction of arrow along line C-C' in FIG. 14(a). A memory cell 200 of this embodiment is identical to that of embodiment 1 except that a current controlling element 110 is provided between the other opening of the through-hole 4 and the second wire 9. Therefore, in FIG. 14, the same constituents as those in FIG. 1 are designated by the same reference symbols, and description of them is omitted.

The memory cell 200 includes the resistance variable element 100 and a current controlling element 110 connected in series with the resistance variable element 100.

The current controlling element 110 exhibits a non-linear current characteristic (resistance value is larger in a range [low-voltage range] in which an absolute value of a voltage is smaller and is smaller in a range [high-voltage range] in which the absolute value of the voltage is larger) with respect to positive and negative voltages, and is a so-called bidirectional current controlling element. A specific structure of the current controlling element 110 may be, for example, a MIM (Metal-Insulator-Metal) diode, a MSM (Metal-Semiconductor-Metal) diode, or a varistor.

By connecting the current controlling element 110 in series with the resistance variable element 100, a sufficient current can be applied to the resistance variable element while easily preventing the crosstalk, in a cross-point memory incorporating a bipolar resistance variable element.

Figure 15:
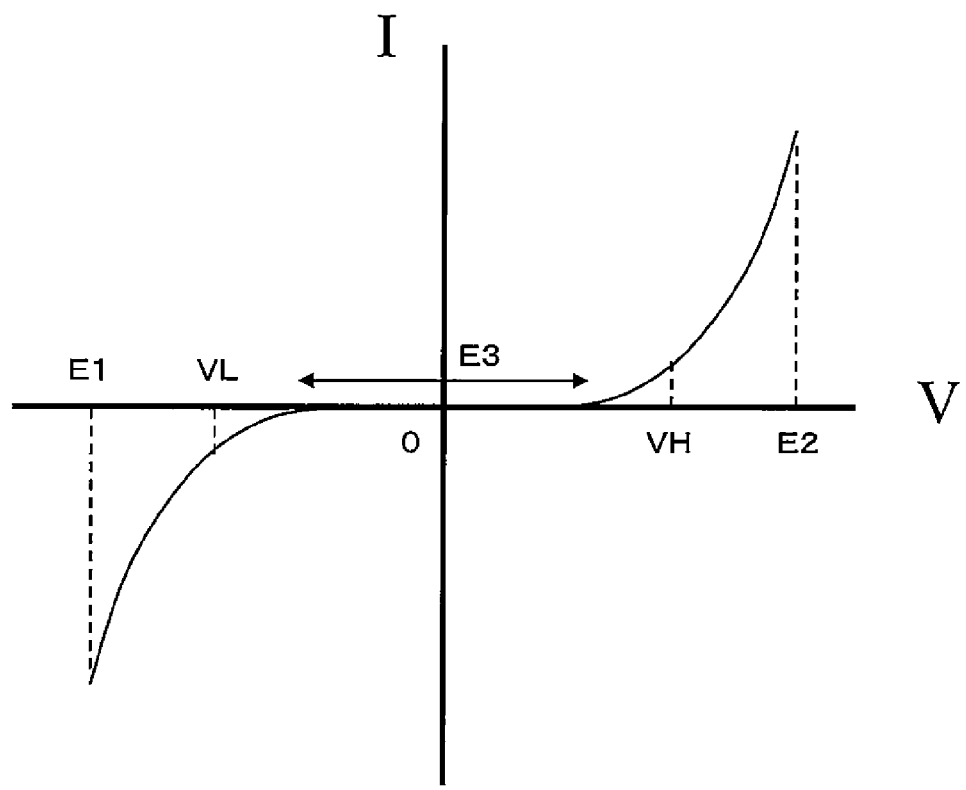
FIG. 15 is a view schematically showing a current-voltage characteristic (I-V characteristic) of a current controlling element 110 of the present invention.

FIG. 15 is a view schematically showing a current-voltage characteristic (I-V characteristic) of the current controlling element 110. As shown in FIG. 15, when a positive voltage (positive voltage larger in absolute value than VH) higher than VH is applied, and a negative voltage (negative voltage larger in absolute value than −VL) which is lower than VL is applied, the electric resistance of the current controlling element 110 becomes relatively low. When a positive voltage (positive voltage which is not larger in absolute value than VH) which is not higher than VH is applied, and a negative voltage (negative voltage which is not larger in absolute value than −VL) which is not lower than VL is applied, the electric resistance of the current controlling element 110 becomes relatively high. It should be noted that the voltage is defined as an electric potential at a side of the current controlling element 110, which is opposite to a side of the current controlling element 110 which is closer to the resistance variable layer.

Figure 17:
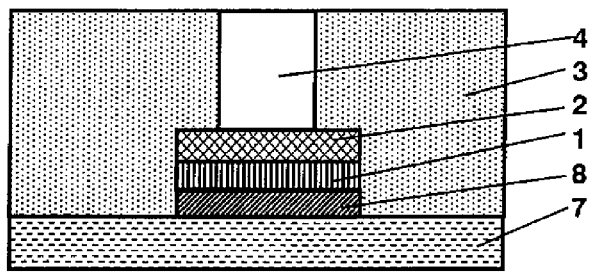
Figure 17:
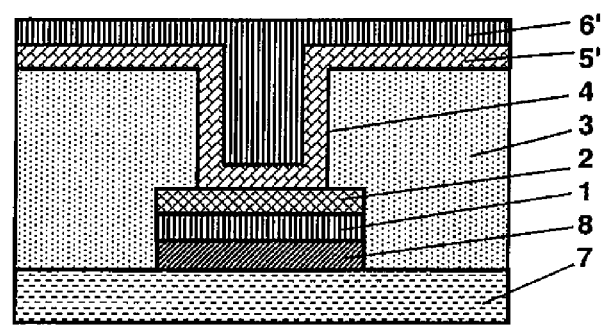
Figure 17:
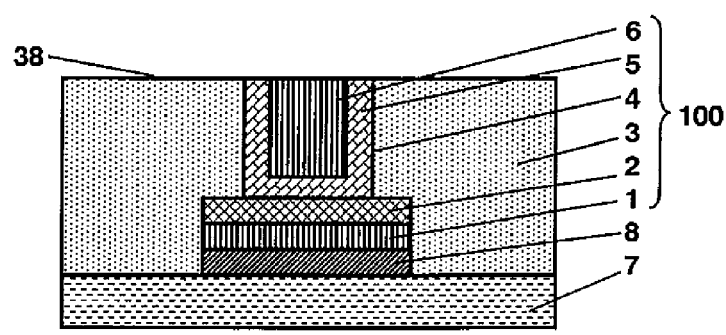
Figure 17:
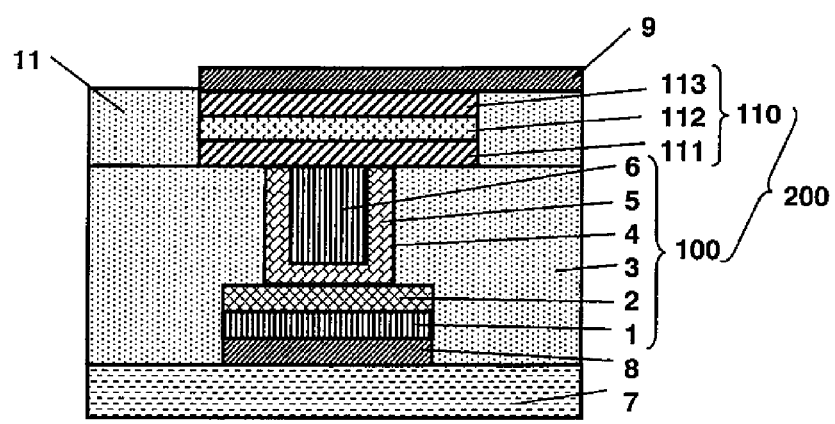

The current controlling element 110 may have a structure in which, for example, a third electrode 111, a current controlling layer 112, and a fourth electrode 113 are stacked together in this order (see FIG. 17($d$)). As a material of the current controlling layer 112, compound semiconductor such as GaN, oxide such as $Al_2O_3$, $SiO_2$, or $Ta_2O_5$, ZnO-based varistor (substance formed by adding to ZnO, $Bi_2O_3$, $Sb_2O_3$, CoO, MnO, $Cr_2O_3$, SrO, BaO, $Pr_2O_3$, etc), nitride such as $SiN_x$ (x>0), a-Si having a joint, organic substance, etc. The material of the current controlling layer 112 is, of course, not limited to this, so long as it exhibits a nonlinear voltage-current characteristic in which the resistance value decreases as the absolute value of the applied voltage increases at a joint to adjacent electrode.

As the current controlling element 110 combined with the resistance variable element 100, the MSM diode is particularly suitable. In such a configuration, the current controlling element 110 can flow a higher current than the MIM diode, because of its structure in which semiconductor is sandwiched between metals. Therefore, a range of a current capable of being flowed can be increased. A characteristic of the MSM diode is attributed to an electric potential barrier formed between metal and semiconductor adjacent to the metal. The varistor utilizes a characteristic of a grain boundary of crystal to control a current. In the MSM diode which utilizes amorphous semiconductor, a characteristic variation due to the structure of semiconductor does not arise in principle. Therefore, the MSM diode does not cause an operation characteristic variation in a miniaturized structure and may be regarded as a more preferable current controlling element. In particular, a current controlling element including $SiN_z$ (0<z) as the current controlling layer 112 is suitable. The reason and experimental data which is a basic of the reason are described in detail in patent literature 4 (the same applicant as one who filed this application) and will not be described in detail repetitively.

As a material (third electrode material) of the third electrode 111 and a material (fourth electrode material) of the fourth electrode 113, for example, tantalum nitride (TaN), etc, is used.

In the memory cell 200, the resistance variable element 100 is connected in series with the current controlling element 110, and a voltage is applied between both ends of a series path. In such a configuration, a more stable operation can be implemented by properly setting the voltages E1, E2, and E3. To be specific, when the read pulse voltage E3 is applied, the electric resistance of the current controlling element 110 becomes relatively high and a ratio of a voltage fed to the current controlling element 110 to the applied voltage is high. On other hand, when the voltage E1 or the voltage E2 is applied, the electric resistance of the current controlling element 110 becomes relatively low and a ratio of a voltage fed to the resistance variable element 100 to the applied voltage is high. When data is written, a voltage with a proper magnitude is applied to the resistance variable layer and data writing can be carried out more surely. When the data is read, the voltage fed to the resistance variable layer becomes low. Therefore, even if a noise or the like is superposed on the read pulse voltage E3, a mistake that the resistance value is rewritten will not be made, and the resistance value can be read without affecting the value of the element. In addition, since the current controlling element is bidirectional, a crosstalk in the cross-point memory is effectively suppressed.

[Manufacturing Method]

Figure 16:
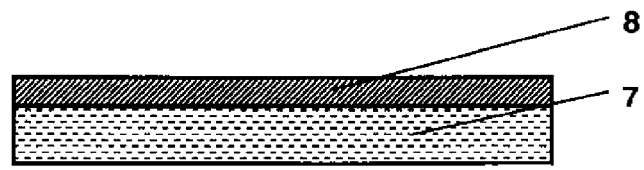
Figure 16:
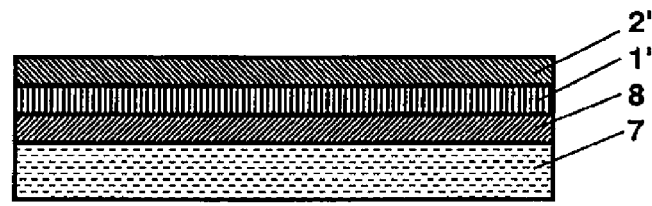
Figure 16:
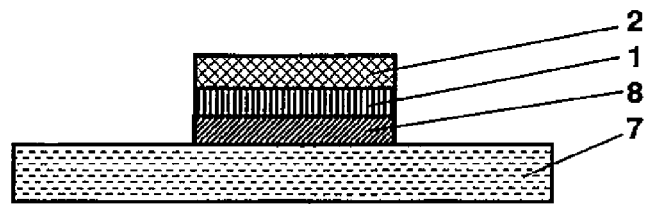
Figure 16:
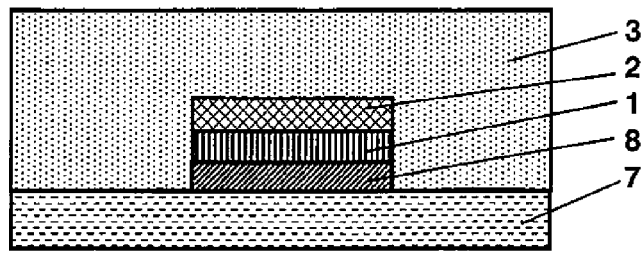

FIGS. 16 and 17 are step views showing an exemplary method of manufacturing a memory cell according to Embodiment 2 of the present invention, in which FIG. 16($a$) is a view showing a step of forming the first wire 8 on the substrate 7, FIG. 16($b$) is a view showing a step of stacking the first electrode material layer 1' and the first resistance variable material layer 2' on the first wire 8, FIG. 16($c$) is a view showing a step of completing the first electrode 1 and the first resistance variable layer 2, and FIG. 16($d$) is a view showing a step of forming the interlayer insulating layer 3 such that the interlayer insulating layer 3 covers the first electrode 1 and the first resistance variable layer 2. FIG. 17($a$) is a view showing a step of forming the through-hole 4 in the interlayer insulating layer 3. FIG. 17($b$) is a view showing a step of stacking the second resistance variable material layer 5' and the second electrode material layer 6' such that the through-hole 4 is filled with the second resistance variable material layer 5' and the second electrode material layer 6'. FIG. 17($c$) is a view showing a step of exposing the upper surface of the interlayer insulating layer 3. FIG. 17($d$) is a view showing a step of forming the current controlling element 110 and the second wire 9 such that the current controlling element 110 and the second wire 9 cover the second resistance variable layer 5 and the second electrode 6 which are exposed in the other opening of the through-hole 4. FIGS. 16 and 17 show a case where the MSM diode is used as the current controlling element 110.

The steps in FIGS. 16($a$)~16($d$) and FIGS. 17($a$)~17($c$) are identical to those in FIGS. 3($a$)~3($d$) and FIGS. 4($a$)~4($c$) and will not be described repetitively.

After the step of FIG. 17 ($c$), as shown in FIG. 17($d$), the current controlling element 110 and the second wire 9 are formed. To be specific, initially, over a planarized upper surface 38 of the interlayer insulating layer 3, a third electrode material layer, a current controlling material layer and a fourth electrode material layer (these layers are not shown) are stacked in this order by sputtering or CVD. Thereafter, by an etching step using a mask, the current controlling element 110 including the third electrode 111, the current controlling layer 112, and the fourth electrode 113 is formed (current controlling element forming step). Further, a second interlayer insulating layer 11 is deposited by CVD, and planarized by CMP. Then, a wire material such as Al is deposited by sputtering to cover the exposed fourth electrode 113, and then the second wire 9 of a band shape and with a specified width is formed by an etching step using a mask (second wire forming step).

The deposition method of the third electrode 111, the current controlling layer 112, and the fourth electrode 113 are not limited to CVD. For example, sputtering or ALD (atomic layer deposition) may be used (hereinafter, the same applies to all embodiments and modification examples).

ADVANTAGES

In the memory cell of this embodiment, the same advantages as those achieved by the resistance variable element of Embodiment 1 are achieved. In addition, since the resistance variable element is connected in series with the current controlling element in the memory cell of this embodiment, a more stable operation is implemented and a crosstalk in the cross-point memory is effectively suppressed.

Since the current controlling element 110 is formed outside the other opening of the through-hole 4 where unevenness is less, it is possible to implement memory cells which have the same electric characteristic and a less variation. Since the resistance variable element is connected in series with the current controlling element compactly, it is possible to implement a memory device which is highly integrated, is adapted for a high productivity and is highly reliable.

Modification Example

The resistance variable elements of modification examples 1~4 of Embodiment 1 are applicable to the memory cell of this embodiment. A vertical positional relationship between the resistance variable element and the current controlling element is not limited, but the resistance variable element may be formed above the current controlling element. One electrode may be provided at a connecting portion where the current controlling element is connected to the resistance variable element. In other words, the current controlling element and the resistance variable element may share the same electrode. The first wire and/or the second wire may be used as the electrode(s) of the current controlling element and/or the resistance variable element.

Alternatively, the first electrode 1 and the first resistance variable layer 2 may be formed to cover the entire upper surface of the first wire 8. In a further alternative, the fourth electrode 113 and the current controlling element 112 may protrude outward over the upper surface of the third electrode 111 (see FIG. 18). This structure is implemented by depositing materials constituting the current controlling layer 112, the fourth electrode 113 and the second wire 9 in this order, by sputtering, etc., after forming the third electrode 111, and processing these three layers in the shape of the second wire 9 together by etching or the like.

Embodiment 3

Figure 19:
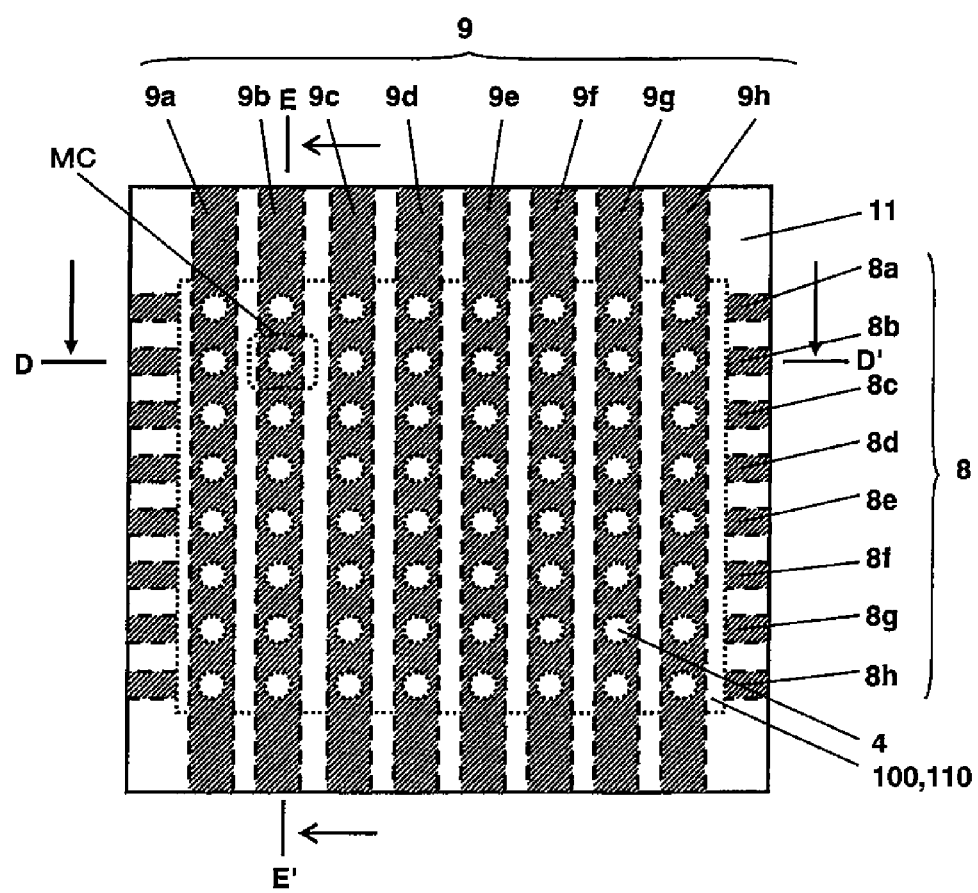
FIG. 19 is a plan view showing an exemplary schematic configuration of a resistance variable memory device according to Embodiment 3 of the present invention.
Figure 20:
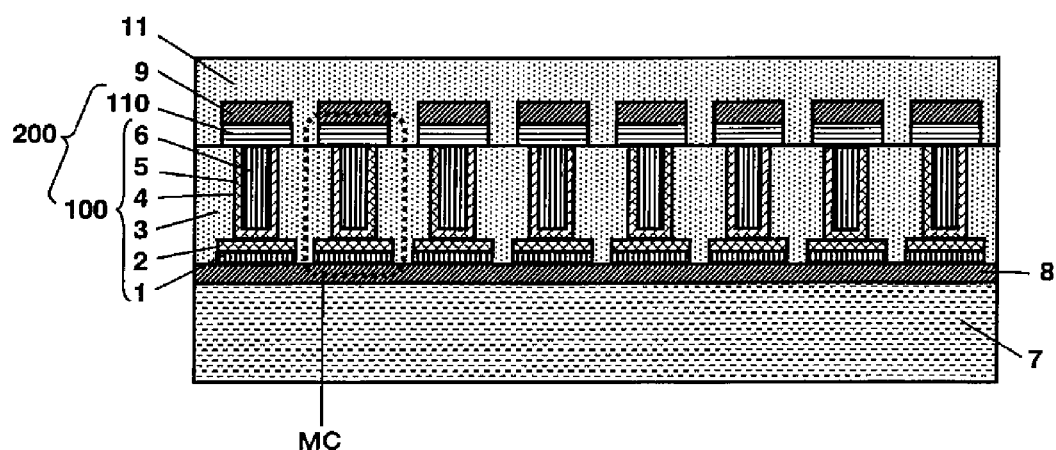
Figure 20:
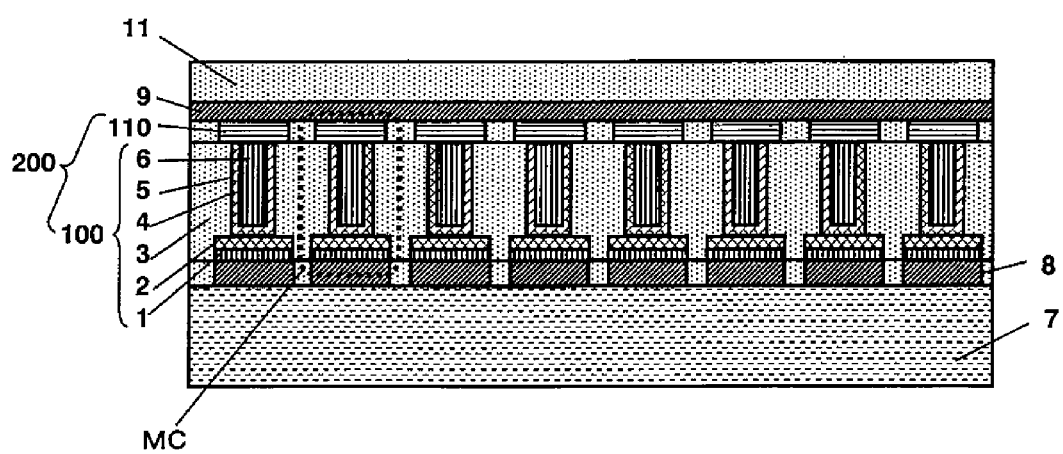

FIG. 19 is a plan view showing an exemplary schematic configuration of a resistance variable memory device according to Embodiment 3 of the present invention. FIG. 20 are cross-sectional views showing an exemplary schematic configuration of the resistance variable memory device according to Embodiment 3 of the present invention, in which FIG. 20(a) is a view taken in the direction of arrow along line D-D' in FIG. 19, and FIG. 20(b) is a view taken in the direction of arrow along line E-E' in FIG. 19.

As shown in FIGS. 19 and 20, a resistance variable memory device 300 of this embodiment includes the substrate 7, a plurality of first wires 8 (8a~8h) formed to extend in parallel with each other in a first direction within a first plane parallel to a main surface of the substrate 7, a plurality of second wires 9 (9a~9h) formed to extend in parallel with each other in a second direction within a second plane parallel to the first plane and three-dimensionally cross the plurality of first wires 8, respectively, and memory cells MC respectively formed at three-dimensional cross-points of the first wires 8 and the second wires 9. Each of the memory cells MC includes the resistance variable element 100 of Embodiment 1, and the current controlling element 110 connected in series with the resistance variable element 100, and the interlayer insulating layer 3 is formed between the first plane and the second plane.

The current controlling element 110 preferably covers one of openings of the through-hole 4 corresponding to the resistance variable element 100 constituting the associated memory cell MC, which opening is not covered with the first resistance variable layer 2.

The current controlling element 110 may be formed at one of both sides of the interlayer insulating layer 3, where the first resistance variable layer 2 of the resistance variable element 100 constituting the associated memory cell MC is provided.

The current controlling element 110 may be at least one element selected from a group consisting of the MIM diode, the MSM diode, and the varistor.

The memory cell MC has the same configuration as that of the memory cell 200 of Embodiment 2. The constituents in the memory cell MC are designated by the same reference symbols as those shown in FIG. 14 and will not be described in detail repetitively.

The resistance variable memory device 300 is a through-hole cross-point structure memory device having a memory cell array in which memory cells 200 of Embodiment 2 are arranged in matrix.

The operation of the resistance variable memory device 300 is identical to that of Embodiment 1 in the constituents of the resistance variable element. The operation of the memory cell array is identical to that of a general cross-point memory array, and will not be described in detail.

A manufacturing method of the resistance variable memory device 300 is identical to that of Embodiment 2 and will not be described in detail repetitively.

In the resistance variable memory device 300, it is possible to easily implement the layer-stacked structure of the resistance variable layer, in the through-hole cross-point structure memory device. Since the current controlling element is connected in series with the resistance variable element, an incorrect operation due to a crosstalk associated with adjacent memory device is suppressed, and thus, a highly reliable memory device is implemented. Moreover, using a mass production process which is compatible with a process adapted for miniaturized configuration, it is possible to easily manufacture a resistance variable memory device which is operative stably and is highly integrated. When the MIM diode, the MSM diode, or the varistor is used as the current controlling element, it is possible to easily prevent a cross talk and apply a sufficient current to the resistance variable element, in a case where the resistance variable element performs a bipolar operation. Even when a minute noise voltage is applied to the memory cell via a power supply line, a most part of the voltage can be absorbed by the current controlling element. As a result, an incorrect operation in which the resistance value of the resistance variable element is rewritten inadvertently can be prevented substantially.

Modification examples similar to those of Embodiment 1 and Embodiment 2 are applicable to Embodiment 3.

Embodiment 4

Element Configuration

Figure 21:
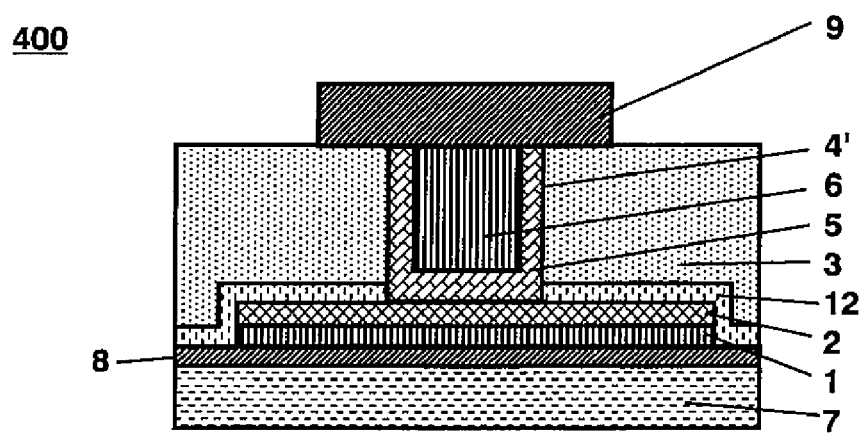
FIG. 21 is a cross-sectional view showing an exemplary schematic configuration of a resistance variable element according to Embodiment 4 of the present invention.

FIG. 21 is a cross-sectional view showing an exemplary schematic configuration of a resistance variable element according to Embodiment 4 of the present invention.

As shown in FIG. 21, a resistance variable element 400 of this embodiment has a configuration in which a resistivity of transition metal oxide of the first resistance variable layer 2 is higher than a resistivity of transition metal oxide of the second resistance variable layer 5, an etching stopper layer 12 having a resistance to etching using an etching gas containing a fluorine compound gas, is provided between the interlayer insulating layer 3 and the first resistance variable layer 2, and a through-hole 4' is formed to penetrate the interlayer insulating layer 3 and the etching stopper layer 12, in addition to the constituents of the resistance variable element 100 of Embodiment 1.

In such a configuration, even when the etching using the etching gas containing the fluorine compound gas, is conducted to form the through-hole, the first resistance variable layer is less likely to get degraded The etching stopper layer 12 preferably comprises at least one material selected from a group consisting of SiN, SiON, and SiCN. The etching stopper layer 12 preferably has a thickness which is not less than 5 nm.

The thickness of the etching stopper layer 12 is preferably sufficiently smaller than the thickness of the interlayer insulating layer 3, and is preferably set to, for example, not less than 5 nm and not more than 30 nm.

Figure 22:
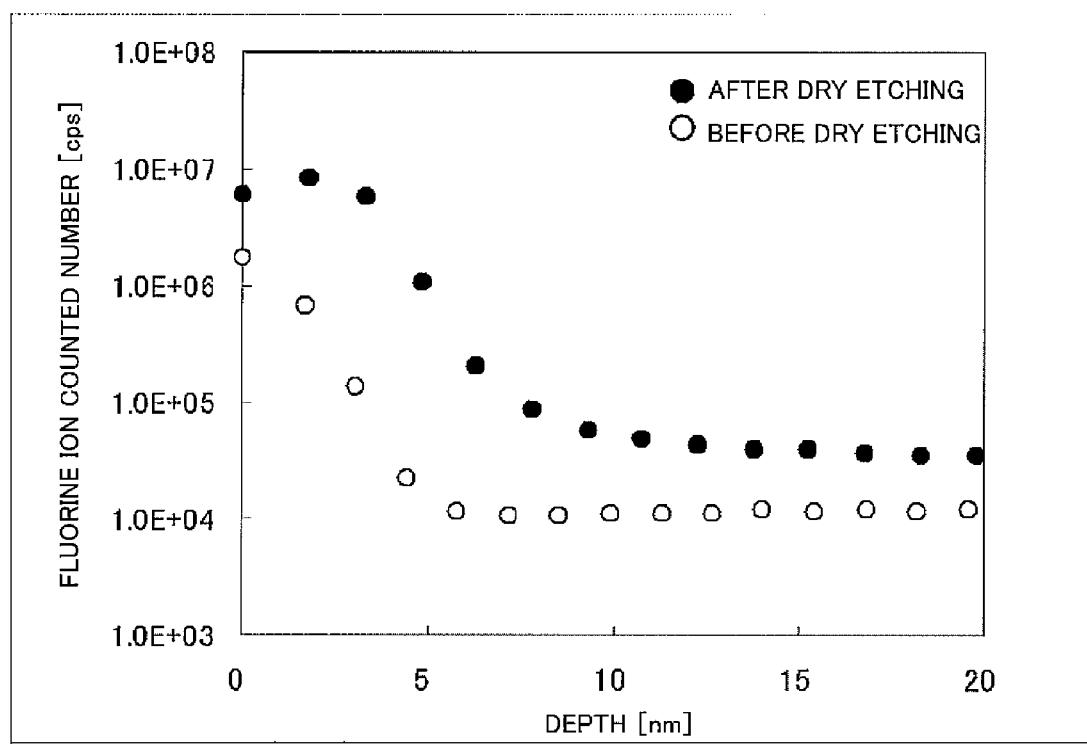
FIG. 22 is a view showing concentration distributions of fluorine in a depth direction of a $TaO_x$ layer before and after performing a dry etching process.

As can be seen from FIG. 22, it may be presumed that fluorine makes ingress into a region having a depth between a value less than 5 nm and a surface of a $TaO_x$ layer. Silicon nitride (SiN), silicon oxynitride (SiON), or silicon carbon nitride (SiCN) used as the etching stopper layer has a dense structure for preventing fluorine from making ingress thereinto. To suppress ingress of fluorine into the $TaO_x$ layer through the etching stopper layer and suppress a thickness variation in the resistance variable layers, the thickness of the etching stopper layer is preferably set to not less than 5 nm.

It should be noted that, it is necessary to expose the first resistance variable layer 2 by removing the etching stopper layer 12 left at the bottom portion of the contact hole using dry etching using an inactive gas or wet etching. To ensure perpendicularity of the through-hole 4 with respect to the substrate, the etching stopper layer 12 is preferably made as thin as possible.

In view of the above, the etching stopper layer 12 is preferably designed to have a thickness such that the etching stopper layer 12 is left in 5 nm or more thickness and the first resistance variable layer 2 is not exposed after a dry etching step using a fluorinated etching gas used for forming the through-hole 4" in the interlayer insulating layer 3.

For example, when the thickness of the interlayer insulating layer 3 is 300 nm, the etching stopper layer 12 is desirably designed to have an about 20 nm thickness assuming that a variation in the thickness of the interlayer insulating layer 3 in wafer surface is ±10%, a selectivity (etching rate ratio) of the etching stopper layer 12 with respect to the interlayer insulating layer 3 is 15, a variation in etching rate within the wafer surface is ±10%, and a thickness variation in the etching stopper layer 12 in a wafer surface is ±10%, and if overetching is added 30%.

SiN has an oxygen barrier property. By providing the etching stopper layer 12 comprising SiN on the first resistance variable layer 2, it is possible to suppress the first resistance variable layer 2 from being oxidized due to ozone or heating of the substrate which occurs in a step of forming the interlayer insulating layer 3 on the etching stopper layer 12. By providing the etching stopper layer 12 comprising SiN, a composition, a forming method, or a temperature of the interlayer insulating layer 3 can be selected more flexibly.

As shown in FIG. 17(d), the current controlling element 110 may be formed between the resistance variable element 400 and the second wire 9 to form a memory cell 500.

Experiment Example

Hereinafter, a reason why the etching stopper layer is provided will be described. In any one of configurations of the resistance variable elements 100, 100' and 100" shown in FIGS. 1, 9 and 12, respectively, the through-hole 4 penetrating the interlayer insulating layer 3 and reaching the first resistance variable layer 2 is typically formed by dry etching. In this case, the first resistance variable layer 2 exposed inside the through-hole 4 is exposed to an etching gas.

The inventors found out that a characteristic of the resistance variable layer is degraded because of the fact that $TaO_x$ is exposed to the etching gas containing the fluorine compound gas when the first resistance variable layer 2 was formed to comprise $TaO_x$. To be specific, it was observed that the resistance values of the resistance variable element became extremely high and did not change even though electric pulses were applied, in many occasions. The inventors studied intensively and presumed that radical fluorine ion contained in etching gas plasma made ingress into the resistance variable layer, changed the composition of the resistance variable layer, and degraded the characteristic of the resistance variable element. It is considered that such a mechanism applies to other transition metal oxides exhibiting a resistance changing characteristic in the same manner.

Hereinafter, a detail of an experiment conducted by the present inventors how the etching using the etching gas containing the fluorine compound gas affects the resistance variable layer will be described.

Initially, a sample with tantalum oxide deposited on a substrate was prepared and a surface of the tantalum oxide was measured by the secondary ion mass spectrometry (SIMS). Then, the surface of the tantalum oxide was dry-etched using a mixture gas (etching gas containing a fluorine compound gas) of $C_5F_8$, $O_2$, and Ar, and then the surface of the tantalum oxide was measured by the secondary ion mass spectrometry (SIMS). Measured elements were fluorine (F), oxygen (O) and carbon (C).

FIG. 22 is a view showing concentration distribution of fluorine in a depth direction of the $TaO_x$ layer before and after performing the dry etching process. In FIG. 22, vertical axis indicates counted fluorine ion number (cps) and a horizontal axis indicates a depth (nm) from the surface of the $TaO_x$ layer. White circles indicate the data before the dry etching and black circles indicate the data after the dry etching.

From the result of FIG. 22, it was evident that fluorine made ingress into the surface of the $TaO_x$ layer due to the dry etching process using the fluorinated gas. It was estimated from a half-value width, a large quantity of fluorine substantially made ingress into a region between a depth of about 5 nm and the surface of the $TaO_x$ layer. Similar results were obtained when other fluorine-compound gases, for example, $CF_4$, $CHF_3$, and $SF_6$ were used. It was observed fluorine ions were present near the surface of the $TaO_x$ layer before the dry etching process as well. It was considered that for some reason or other, fluorine made ingress into the surface of the $TaO_x$ layer before the dry etching process.

Figure 23:
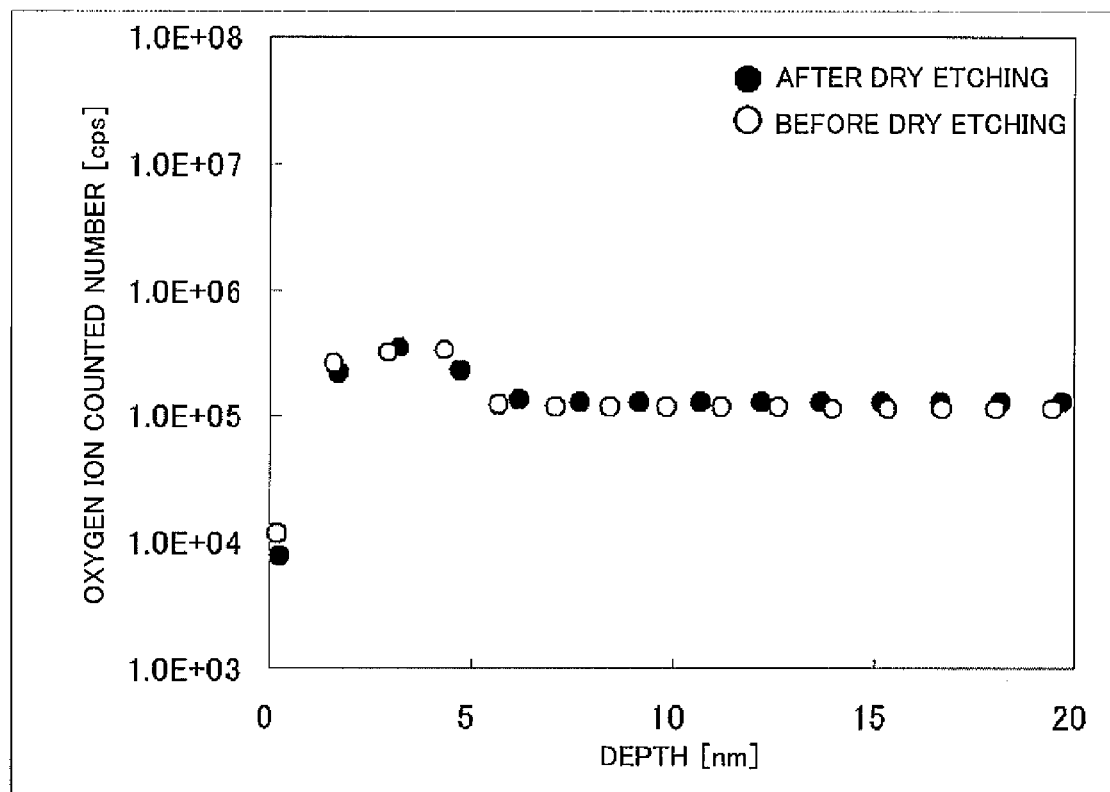
FIG. 23 is a view showing concentration distributions of oxygen in a depth direction of the $TaO_x$ layer before and after performing the dry etching process.
Figure 24:
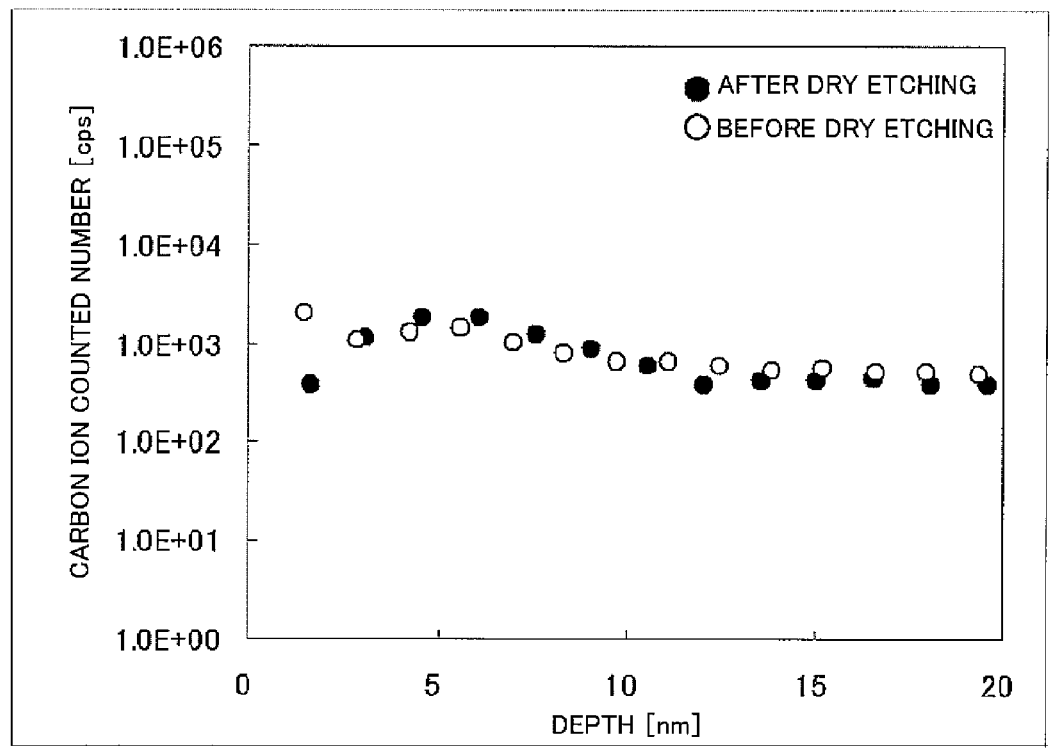
FIG. 24 is a view showing concentration distributions of carbon in a depth direction of the $TaO_x$ layer before and after performing the dry etching process.

FIG. 23 is a view showing concentration distributions of oxygen in a depth direction of the $TaO_x$ layer before and after performing the dry etching process. FIG. 24 is a view showing concentration distributions of carbon in a depth direction of the $TaO_x$ layer before and after performing the dry etching process.

From the results of FIGS. 23 and 24, it can be seen that oxygen and carbon did not substantially make ingress into the surface of the $TaO_x$ layer. Therefore, it may be presumed that the characteristic of the resistance variable element was degraded due to the ingress of fluorine.

From the above results, it was considered that there was a need for a manufacturing method or element structure for protecting the resistance variable layer from the etching using the etching gas containing the fluorine compound gas or an additional step for restoring the composition of the resistance variable layer after it is degraded by being exposed to the etching gas containing the fluorine compound gas.

When forming the contact hole connected with the resistance variable layer, the resistance variable layer is somewhat etched and its thickness is reduced. Because of this influence, a variation in the thickness of the resistance variable layer increases, and causes a variation in the resistance values and operation characteristics (voltage and pulse width of electric pulses for causing resistance change) of the resistance variable element.

There is also, a problem that, by the step of forming the interlayer insulating layer on the resistance variable layer, the resistance variable layer is oxidized. For example, it is assumed that the resistance variable layer is formed to comprise $TaO_x$ and a NSG layer is formed by $O_3$-TEOS as the interlayer insulating layer on the resistance variable layer. $TaO_x$ of the resistance variable layer is further oxidized into tantalum pentoxide ($Ta_2O_5$) which is an insulator due to a material gas used in this case or substrate heating. If $TaO_x$ is converted into tantalum pentoxide ($Ta_2O_5$), the resistance variable layer does not exhibit a resistance changing characteristic any more.

In this embodiment, such a problem is addressed by providing the etching stopper layer 12 having a resistance to etching using the etching gas containing the fluorine compound gas between the interlayer insulating layer 3 and the first resistance variable layer 2. As described in Embodiment 1, a degraded portion of the resistance variable layer may be removed by etch-back and thereafter the second resistance variable layer may be formed.

In accordance with the configuration of this embodiment, it is possible to suppress oxidation of the resistance variable layer occurring during formation of the interlayer insulating layer or during thermal treatment, or ingress of radical fluorine contained in the etching gas plasma into the resistance variable layer, and reduce a variation in the thicknesses of the resistance variable layers.

[Manufacturing Method]

Figure 25:
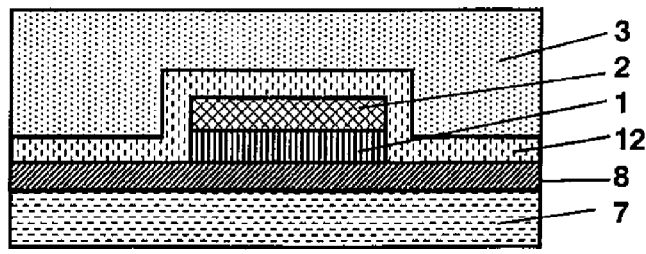
Figure 25:
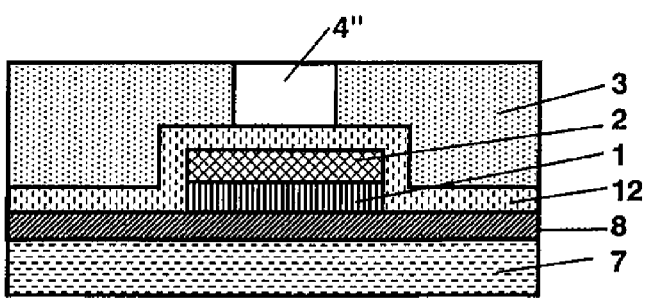
Figure 25:
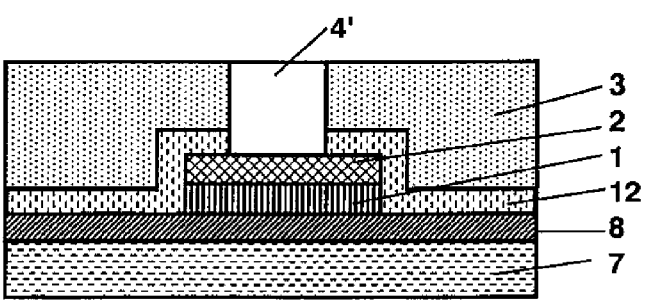
Figure 25:
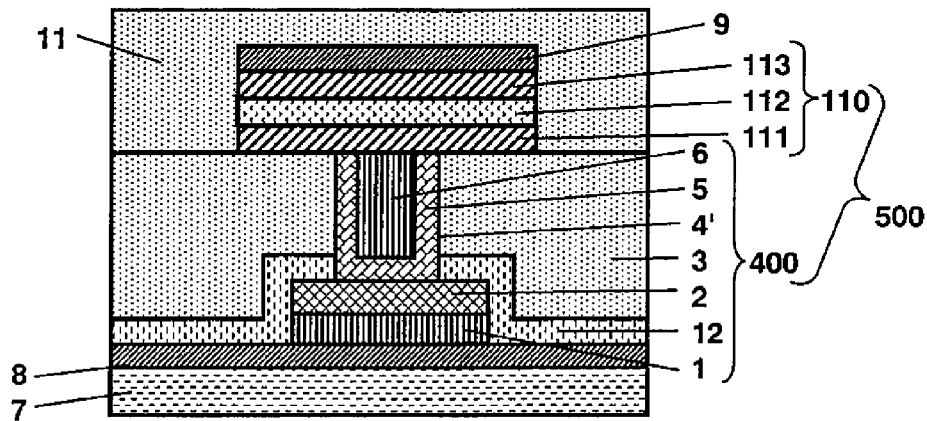

FIG. 25 is step views showing an exemplary method of manufacturing the resistance variable element and the memory cell according to Embodiment 4 of the present invention, in which FIG. 25(a) is a view showing a step of forming the first wire 8, the first electrode 1, the first resistance variable layer 2, the etching stopper layer 12 and the interlayer insulating layer 3, on the substrate 7, FIG. 25(b) is a view showing a step of forming a through-hole 4" in the interlayer insulating layer 3, FIG. 25(c) is a view showing a step of forming the through-hole 4' in the etching stopper layer 12, and FIG. 25(d) is a view showing a step of forming the second resistance variable layer 5, the second electrode 6, the current controlling element 110 and the second wire 9.

The manufacturing method of the resistance variable element of this embodiment includes, in addition to the steps of the manufacturing method of Embodiment 1, an etching stopper layer forming step between the first resistance variable layer forming step and the interlayer insulating layer forming step, which is a step of forming the etching stopper layer 12 having a resistance to the etching using the etching gas containing the fluorine compound gas on the first resistance variable layer 2, and the interlayer insulating layer forming step is a step of forming the interlayer insulating layer 3 on the first resistance variable layer and the etching stopper layer.

A through-hole forming step preferably includes an interlayer insulating layer removing step of removing the interlayer insulating layer 3 by etching using the etching gas containing the fluorine compound gas and an etching stopper layer removing step of removing the etching stopper layer 3 by etching which does not use the fluorine compound gas.

As the "etching which does not use the fluorine compound gas", dry etching using an inactive gas or wet etching may be used.

The manufacturing method of the resistance variable element 400 and the memory cell 500 will be described below in detail with reference to FIG. 25.

In this embodiment, initially, on the substrate 7, the first wire 8, the first electrode 1 and the first resistance variable layer 2 are formed. This step is identical to that shown in FIG. 3(a)~FIG. 3(c) in Embodiment 1 and will not be described repetitively.

Then, the etching stopper layer 12 and the first interlayer insulating layer 3 are deposited in this order to cover the substrate 7, the first wire 8 and the first resistance variable layer 2. The etching stopper layer 12 comprises for example, SiN, and is deposited by CVD. The interlayer insulating layer 3 is planarized by CMP (FIG. 25(a)).

Then, by the dry etching process, the through-hole 4" is formed to penetrate the interlayer insulating layer 3 and reach the etching stopper layer 12. In this dry etching, a fluorinated gas such as $CF_4$, $C_4F_6$, or $C_5F_8$, is typically used to improve perpendicularity of the shape of the contact hole. The etching using the etching gas containing such the fluorine compound gas stops at a time point when the through-hole 4" has reached the etching stopper layer 12 and does not proceed any more.

For example, consider a case where SiN is used as the etching stopper layer 12, TEOS-$SiO_2$ is used as the interlayer insulating layer 3, and the contact hole is formed by dry etching. For example, under conditions in which $C_5F_8$, $O_2$, and Ar are used as the etching gas at flow rates of 17 sccm/23 sccm/500 sccm, a chamber pressure is 2.1 Pa, and RF electric power is 1800 W, an etching rate of SiN is as small as 1/15 of an etching rate of TEOS-$SiO_2$.

Therefore, when forming the through-hole in the interlayer insulating layer 3 having a relatively great thickness variation, by dry etching, the etching stopper layer 12 can stop the growth of the through-hole 4" even when overetching is performed sufficiently.

As shown in FIG. 25(c), the etching stopper layer 12 exposed in the bottom region of the through-hole 4" is removed by dry etching using only the inactive gas such as argon (Ar), thereby exposing the first resistance variable layer 2. In this way, the through-hole 4' is formed.

For example, consider a case where SiN is used as the etching stopper layer 12 and is removed by dry etching using Ar gas. When Ar flow rate is 100 sccm, chamber pressure is 2.0 Pa, and RF electric power is 900 W, etching rate of the SiN layer is 60 nm/min. If the thickness of the SiN layer is sufficiently as small as not less than 5 nm and not more than 30 nm, the etching stopper layer 12 is removed, and the through-hole 4' can be formed such that the first resistance variable layer 2 is exposed, without degrading the perpendicularity of the through-hole 4' with respect to the substrate.

Since the thickness of the etching stopper layer 12 is small, a thickness variation is less and overetching is not substantially necessary. By inserting the etching stopper layer 12, an amount of depression of the first resistance variable layer 2 made after formation of the through-hole 4' can be reduced. Therefore, a thickness variation in the first resistance variable layer 2 is lessened and a variation in the resistance value is lessened.

Since the etching stopper layer 12 is removed without using the fluorinated etching gas, the first resistance variable layer 2 is not exposed to the fluorinated etching gas. A quality of the first resistance variable layer 2 is not changed, a variation in the resistance values of the first resistance variable layer 2 is reduced, and its resistance changing characteristic is not degraded.

The following steps are identical to those of FIGS. 17(b) ~17(d) of Embodiment 2 and therefore, will not be described in detail repetitively.

Through the above steps, the resistance variable element 400 and the memory cell 500 are manufactured.

The deposition method of the etching stopper layer is not limited to CVD. For example, sputtering or ALD (atomic layer deposition) may be used.

Needless to say, the memory cell of Embodiment 2 or the cross-point memory device of Embodiment 3 can be implemented using the resistance variable element of this embodiment.

Alternatively, the etching stopper layer 12 is not necessarily formed on the first wire 8 but may be formed only on the first resistance variable layer 2.

Although in this embodiment, the resistivity of the transition metal oxide of the first resistance variable layer 2 is higher than the resistivity of the transition metal oxide of the second resistance variable layer 5, an amount of depression of the first resistance variable layer 2 made after formation of the through-hole 4' can also be reduced effectively by inserting the etching stopper layer 12, even when the resistivity of the transition metal oxide of the first resistance variable layer 2 is lower than the resistivity of the transition metal oxide of the second resistance variable layer 5. Therefore, in this case, a thickness variation in the first resistance variable layer 2 is lessened and a variation in the resistance values is lessened. Thus, a manufacturing method of this embodiment is effective to implement a highly reliable resistance variable element which is less in electric characteristic variation or a memory device including such a resistance variable element.

Embodiment 5

Element Configuration

Figure 26:
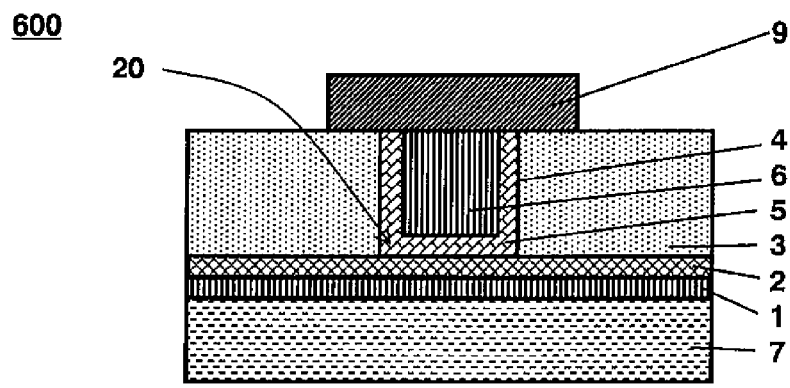
Figure 26:
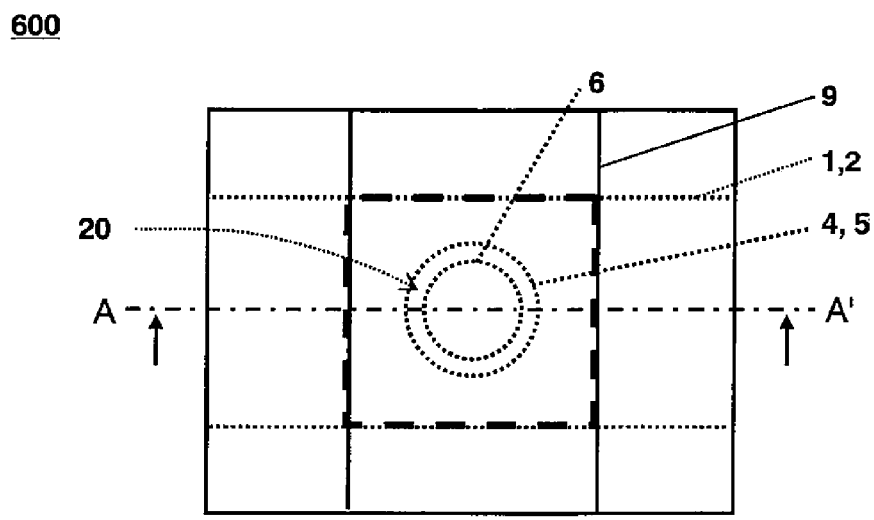

FIG. 26 is a view showing an exemplary schematic configuration of a resistance variable element 600 according to Embodiment 5 of the present invention, in which FIG. 26(a) is a cross-sectional view and FIG. 26(b) is a plan view. FIG. 26(a) is a cross-sectional view taken in the direction of arrow along line A-A' in FIG. 26(b).

As shown in FIG. 26, the resistance variable element 600 includes the substrate 7, and the interlayer insulating layer 3 (insulating layer) formed between the first electrode 1 and the second wire 9 on the substrate 7, and has a configuration in which the through-hole 4 is formed to penetrate the interlayer insulating layer 3 vertically (in thickness direction), the first resistance variable layer 2 comprising transition metal oxide is formed outside the through-hole 4, the second resistance variable layer 5 comprising transition metal oxide is formed inside the through-hole 4, the first resistance variable layer 2 is different in resistivity from the second resistance variable layer 5, and the first resistance variable layer 2 and the second resistance variable layer 5 are in contact with each other only in the opening 20 of the through-hole 4 which is closer to the substrate.

In this embodiment, the resistance variable element 600 may be identical in configuration to the resistance variable element 100 of Embodiment 1 except that the first wire 8 is omitted from the resistance variable element 100 and the first electrode 1 and the first resistance variable layer 2 have the same wire shape when viewed from the thickness direction. Therefore, in the resistance variable element 600, the same constituents as those in the resistance variable element 100 are designated by the same reference symbols and names and will not be described repetitively.

When the second resistance variable layer 5 is formed inside the through-hole 4 and the first resistance variable layer 2 is formed to cover the other opening (upper opening) of the through-hole 4, in a configuration different from that of this embodiment, there is a level difference along an outer edge of the through-hole 4 between an upper end surface of the second resistance variable layer 5 inside the through-hole and an upper end surface of the interlayer insulating layer 3 in which the through-hole 4 is formed. For this reason, there is a difference in thickness of the first resistance variable layer between inside the through-hole and an outer edge portion of the through-hole. However, in the configuration of this embodiment, since the first electrode 1 and the first resistance variable layer 2 are formed to have the same wire shape on the substrate 7 and below the through-hole, a thickness variation in the first resistance variable layer 2 is lessened and a characteristic such as a resistance changing characteristic is made more uniform.

In the resistance variable element 600, preferably, a resistivity of transition metal oxide of the first resistance variable layer 2 is higher than a resistivity of transition metal oxide of the second resistance variable layer 5.

In such a configuration, the thickness of the first resistance variable layer which is a high-resistance variable layer is made uniform. Typically, the thickness of the high-resistance variable layer is as small as about 1~8 nm and is highly required to be uniform.

In the resistance variable element 600, preferably, the second resistance variable layer 5 is formed to cover the bottom portion and side wall of the through-hole 4 and the electrode 6 is filled onto the second resistance variable layer 5 inside the through-hole 4.

As shown in FIG. 26(b), in the resistance variable element 600, preferably, the first resistance variable layer 2 is formed to cover the entire of the opening 20 (bottom portion of the through-hole 4) which is closer to the substrate and protrude outward over the opening 20, when viewed from the thickness direction of the interlayer insulating layer 3, and the second resistance variable layer 5 is formed to cover the entire of the opening 20 (bottom portion of the through-hole 4) which is closer to the substrate and not to protrude outward over the opening 20, when viewed from the thickness direction of the interlayer insulating layer 3.

In such a configuration, the second resistance variable layer is entirely covered with the first resistance variable layer in the opening of the through-hole, and the second resistance variable layer does not contact the electrode provided outside the through-hole. Therefore, an operation of the resistance variable element is stabilized.

[Configuration of Memory Cell]

Figure 27:
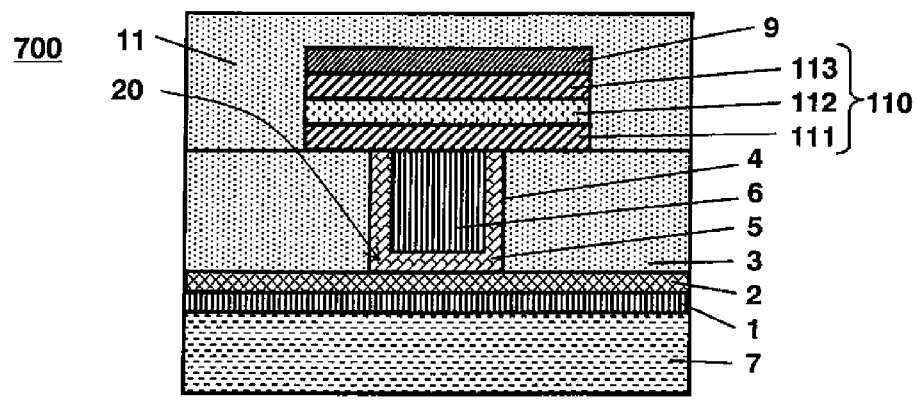
Figure 27:
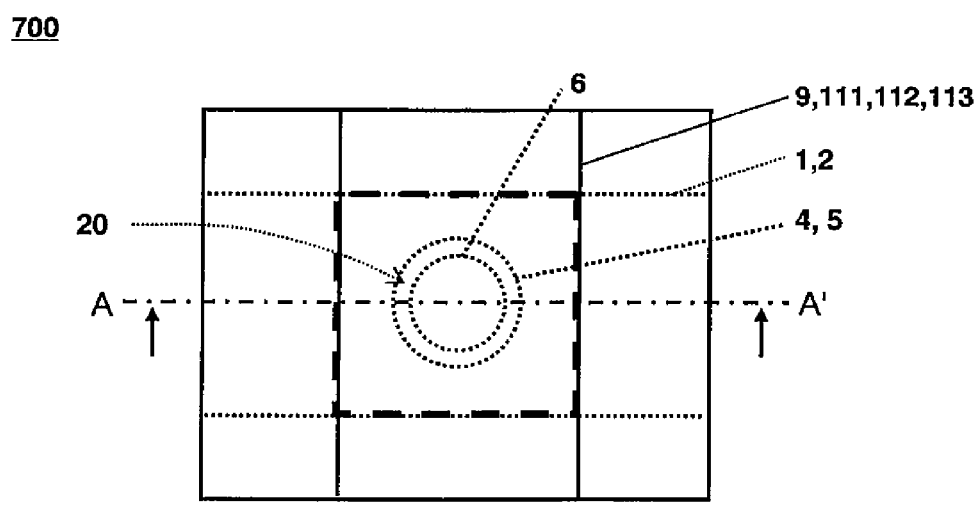

FIG. 27 is a view showing an exemplary schematic configuration of a memory cell 700 according to Embodiment 5 of the present invention, in which FIG. 27(a) is a cross-sectional view and FIG. 27(b) is a plan view. FIG. 27(a) is a cross-sectional view taken in the direction of arrow along line A-A' in FIG. 27(b).

As shown in FIG. 27, the memory cell 700 is identical to the above mentioned resistance variable element 600 except that the current controlling element 110 is provided between the upper opening of the through-hole 4 and the second wire 9. The current controlling element 110 is identical to that included in the memory cell 200 of Embodiment 2. Therefore, in the resistance variable element 700, the same constituents as those in the resistance variable element 600 and the memory cell 200 are designated by the same reference symbols and names and will not be described repetitively. The current controlling element 110 may have a configuration similar to that described in Embodiment 2.

Figure 18:
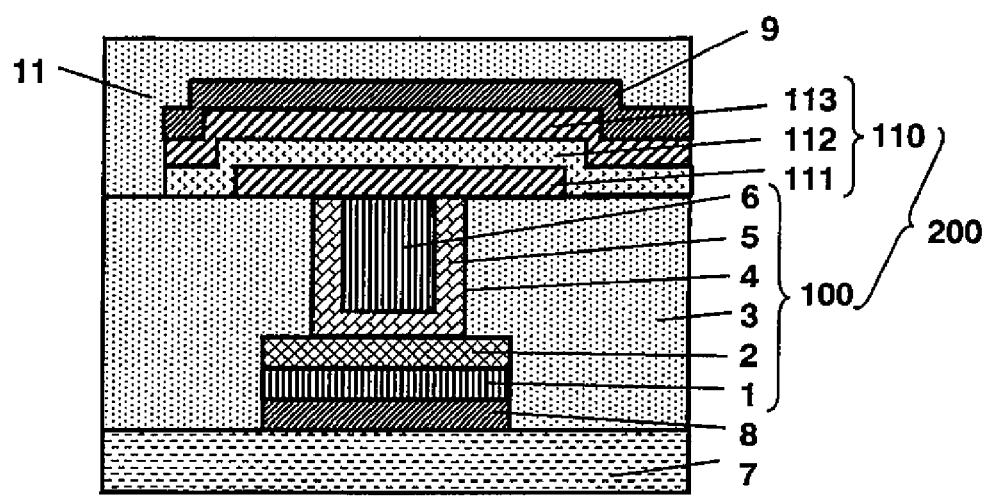
FIG. 18 is a cross-sectional view showing an exemplary schematic configuration of a resistance variable element according to modification example of Embodiment 2 of the present invention.

In Embodiment 5, in the same manner, various modification examples shown in FIGS. 9, 12 and 18 may be used, as in the above described other embodiments.

The manufacturing method of the resistance variable element 600 and the memory cell 700 may be identical to those of Embodiment 1 and Embodiment 2, and will not be described in detail repetitively.

In Embodiment 5, the etching stopper layer 12 of Embodiment 4 may be provided.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable element and a resistance variable memory device of the present invention are useful as a resistance variable element and a resistance variable memory device which easily implement a layer-stacked structure of the resistance variable layer, in a through-hole cross-point structure memory device.

REFERENCE CITATION LISTS

1 first electrode
1' first electrode material layer
2 first resistance variable layer
2' first resistance variable material layer
3 interlayer insulating layer
4 through-hole
4' through-hole
4" through-hole
5 second resistance variable layer
5' second resistance variable material
6 second electrode
6' second electrode material layer
7 substrate
8 first wire
9 second wire
10 insulating layer
11 second interlayer insulating layer
12 etching stopper layer
20 opening
100 resistance variable element
100' resistance variable element
100" resistance variable element
110 current controlling element
111 third electrode
112 current controlling layer
113 fourth electrode
150 resistance variable element
200 memory cell
300 resistance variable memory device
400 resistance variable element
500 memory cell
600 resistance variable element
700 memory cell

The invention claimed is:

1. A method of manufacturing a resistance variable element comprising:
a first electrode forming step of forming a first electrode on a substrate;
a first resistance variable layer forming step of forming a first resistance variable layer comprising transition metal oxide, on the first electrode;
an interlayer insulating layer forming step of forming an interlayer insulating layer on the first resistance variable layer;
a through-hole forming step of forming a through-hole on the first resistance variable layer such that the through-hole penetrates the interlayer insulating layer;
a second resistance variable layer forming step of forming a second resistance variable layer comprising transition metal oxide such that the second resistance variable layer is in contact with the first resistance variable layer only in the one of the openings of the through-hole, inside the through-hole, the second resistance variable layer being different in resistivity from the first resistance variable layer; and
a step of forming a second electrode on the second resistance variable layer; wherein
an electric resistance between the first electrode and the second electrode changes by application of an electric pulse between the first electrode and the second electrode.

2. The method of manufacturing the resistance variable element according to claim 1, wherein the first resistance variable layer covers entire of the one of the openings of the through-hole and protrudes outward over the one of the openings.

3. The method of manufacturing the resistance variable element according to claim 1, further comprising:
an etching stopper layer forming step of forming an etching stopper layer on the first resistance variable layer, between the first resistance variable layer forming step and the interlayer insulating layer forming step, the etching stopper layer having a resistance to etching using an etching gas containing a fluorine compound gas;
wherein in the interlayer insulating layer forming step, the interlayer insulating layer is formed on the first resistance variable layer and the etching stopper layer.

4. The method of manufacturing the resistance variable element according to claim 3, wherein in the through-hole forming step, the interlayer insulating layer is etched using an etching gas containing a fluorine-compound gas, and the etching stopper layer is etched using an inactive gas.

5. A resistance variable element comprising:
a substrate;
a first electrode formed on the substrate;
a second electrode; and
an interlayer insulating layer;
wherein a through-hole is formed to penetrate the interlayer insulating layer;
a first resistance variable layer comprising transition metal oxide is formed outside the through-hole such that the first resistance variable layer is connected to the first electrode located outside the though-hole;
a second resistance variable layer comprising transition metal oxide is formed inside the through-hole;
the second electrode is formed on the second resistance variable layer;
the first resistance variable layer is different in resistivity from the second resistance variable layer;

the first resistance variable layer and the second resistance variable layer are in contact with each other only in one of openings of the through-hole, which opening is closer to the substrate; and an electric resistance between the first electrode and the second electrode changes by application of an electric pulse between the first electrode and the second electrode.

6. The resistance variable element according to claim 5, wherein the resistivity of the transition metal oxide of the first resistance variable layer is higher than the resistivity of the transition metal oxide of the second resistance variable layer.

7. The resistance variable element according to claim 5, wherein the second resistance variable layer covers a bottom portion and a side wall of the through-hole, the resistance variable element further comprising:

an electrode filled inside the through-hole such that the electrode is located on the second resistance variable layer.

8. The resistance variable element according to claim 5, wherein the first resistance variable layer covers entire of the opening of the through-hole which is closer to the substrate and protrudes outward over the entire opening when viewed from a thickness direction of the interlayer insulating layer; and the second resistance variable layer covers entire of the one of the openings of the through-hole and does not protrude outward over the one of the openings when viewed from the thickness direction of the interlayer insulating layer.

9. The resistance variable element according to claim 5, wherein each of the transition metal oxide of the first resistance variable layer and the transition metal oxide of the second resistance variable layer is an oxide of at least one transition metal which is selected from a group consisting of Ta, Hf and Zr.

10. The resistance variable element according to claim 1, wherein the transition metal oxide of the first resistance variable layer and the transition metal oxide of the second resistance variable layer are tantalum oxides, respectively;

when one of the tantalum oxides is expressed as $TaO_x$, $0.8 \leq x \leq 1.9$ is satisfied; and when the other tantalum oxide is expressed as $TaO_y$, $x<y$ is satisfied.

11. The resistance variable element according to claim 5, wherein the resistivity of the transition metal oxide of the first resistance variable layer is lower than the resistivity of the transition metal oxide of the second resistance variable layer.

12. The resistance variable element according to claim 5, wherein the resistivity of the transition metal oxide of the first resistance variable layer is higher than the resistivity of the transition metal oxide of the second resistance variable layer; comprising:

an etching stopper layer formed between the interlayer insulating layer and the first resistance variable layer, the etching stopper layer having a resistance to etching using an etching gas containing a fluorine compound gas, the through-hole penetrating the interlayer insulating layer and the etching stopper layer.

13. The resistance variable element according to claim 12, wherein the etching stopper layer comprises at least one material selected from a group consisting of silicon nitride (SiN), silicon oxynitride (SiON) and silicon carbon nitride (SiCN).

14. The resistance variable element according to claim 12 or 13, wherein the etching stopper layer has a thickness which is not less than 5 nm.

15. A resistance variable memory device comprising:

a substrate;

a plurality of first wires formed within a first plane parallel to a main surface of the substrate to extend in parallel with each other in a first direction;

a plurality of second wires formed within a second plane parallel to the first plane to extend in parallel with each other in a second direction and three-dimensionally cross the plurality of first wires, respectively; and memory cells respectively formed at three-dimensional cross-points of the first wires and the second wires;

each of the memory cells including the resistance variable element as recited in claim 5 and a current controlling element connected in series with the resistance variable element; and the interlayer insulating layer being formed between the first plane and the second plane.

16. The resistance variable memory device according to claim 15, wherein the current controlling element covers one of openings of the through-hole corresponding to the resistance variable element constituting a memory cell, which opening is not covered with the first resistance variable layer, the memory cell including the current controlling element and the resistance variable element.

17. The resistance variable memory device according to claim 15, wherein the current controlling element is formed at one of both sides of the interlayer insulating layer, where the first resistance variable layer of the resistance variable element constituting a memory cell is provided, the memory cell including the current controlling element and the resistance variable element.

18. The resistance variable memory device according to claim 15, wherein the current controlling element is at least one element selected from a group consisting of a MIM diode, a MSM diode, and a varistor.

* * * * *